US012580390B2

(12) United States Patent
Wu et al.

(10) Patent No.: US 12,580,390 B2
(45) Date of Patent: Mar. 17, 2026

(54) UNDER-FLOOR CHARGING STATION

(71) Applicant: Taiwan Semiconductor Manufacturing Company, Ltd., Hsinchu (TW)

(72) Inventors: Cheng-Lung Wu, Hsinchu County (TW); Sing-Tsung Li, Taichung City (TW); Ren-Hau Wu, New Taipei City (TW); Yang-Ann Chu, Hsinchu City (TW); Jiun-Rong Pai, Jhubei City (TW); Feng-Kuang Wu, Hsinchu County City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 819 days.

(21) Appl. No.: 17/815,592

(22) Filed: Jul. 28, 2022

(65) Prior Publication Data

US 2022/0368151 A1     Nov. 17, 2022

Related U.S. Application Data

(63) Continuation of application No. 16/887,651, filed on May 29, 2020, now Pat. No. 11,437,843.

(51) Int. Cl.
H02J 7/14        (2006.01)
B60L 53/30        (2019.01)
H01L 21/677        (2006.01)

(52) U.S. Cl.
CPC .............. H02J 7/14 (2013.01); B60L 53/30 (2019.02); H01L 21/67742 (2013.01)

(58) Field of Classification Search
USPC ................ 320/106, 107, 108, 109, 110, 112
See application file for complete search history.

(56) References Cited

U.S. PATENT DOCUMENTS

| 7,397,213 B2 | 7/2008 | In et al. |
| 9,637,014 B2 | 5/2017 | Schneider et al. |
| 9,907,447 B2 | 3/2018 | Tanaka et al. |
| 10,698,411 B1 | 6/2020 | Ebrahimi Afrouzi |
| 10,786,129 B1 | 9/2020 | Ebrahimi Afrouzi et al. |

(Continued)

FOREIGN PATENT DOCUMENTS

| CN | 1954974 A | 5/2007 |
| CN | 209104903 U | 7/2019 |

(Continued)

*Primary Examiner* — Brian Ngo
(74) *Attorney, Agent, or Firm* — Harrity & Harrity, LLP

(57)        ABSTRACT

An under-floor charging station can be mounted under a floor such that a top plate of the under-floor charging station is substantially flush with a top surface of the floor without touching the ground. Openings in the top plate allow charging elements to extend when in use to charge a mobile robot, and to retract under the floor when not in use. The retractable charging elements prevent tripping hazards and allow the mobile robot to move freely throughout a clean room. Moreover, because the charging elements can be retracted in an unobtrusive position when the under-floor charging station is not in use, the under-floor charging station is permitted to be positioned in locations in the clean room that allow the mobile robot to continue working while charging and/or allow non-stop running of the mobile robot.

20 Claims, 18 Drawing Sheets

(56)            References Cited

U.S. PATENT DOCUMENTS

| | | | |
|---|---|---|---|
| 2013/0307477 | A1 | 11/2013 | Reinschke |
| 2014/0222271 | A1 | 8/2014 | Merten et al. |
| 2015/0314688 | A1 | 11/2015 | Thompson |
| 2017/0253130 | A1 | 9/2017 | Bartz et al. |
| 2017/0344014 | A1 | 11/2017 | Wu |
| 2018/0339597 | A1 | 11/2018 | Kruszelnicki |
| 2019/0077271 | A1 | 3/2019 | Aviv et al. |
| 2019/0106004 | A1 | 4/2019 | Heyne et al. |
| 2019/0168630 | A1 | 6/2019 | Mrlik et al. |
| 2019/0263281 | A1 | 8/2019 | Wang |
| 2020/0067329 | A1 | 2/2020 | Liu et al. |
| 2020/0139820 | A1 | 5/2020 | Cole et al. |
| 2020/0144831 | A1* | 5/2020 | Choi .................. H01R 13/5202 |
| 2020/0180456 | A1 | 6/2020 | Kauffmann |
| 2021/0162877 | A1 | 6/2021 | Austrheim |
| 2021/0276441 | A1* | 9/2021 | Ben-David ............. B60L 53/36 |
| 2021/0376649 | A1 | 12/2021 | Wu et al. |
| 2022/0019247 | A1 | 1/2022 | Dayan et al. |
| 2022/0037182 | A1 | 2/2022 | Yoon et al. |

FOREIGN PATENT DOCUMENTS

| | | | |
|---|---|---|---|
| CN | 213501869 | U | 6/2021 |
| EP | 3705355 | B1 | 3/2024 |
| TW | 201111202 | A | 4/2011 |
| TW | M578664 | U | 6/2019 |
| TW | 202015609 | A | 5/2020 |
| WO | 2019073271 | A1 | 4/2019 |
| WO | 2020003304 | A1 | 1/2020 |

* cited by examiner

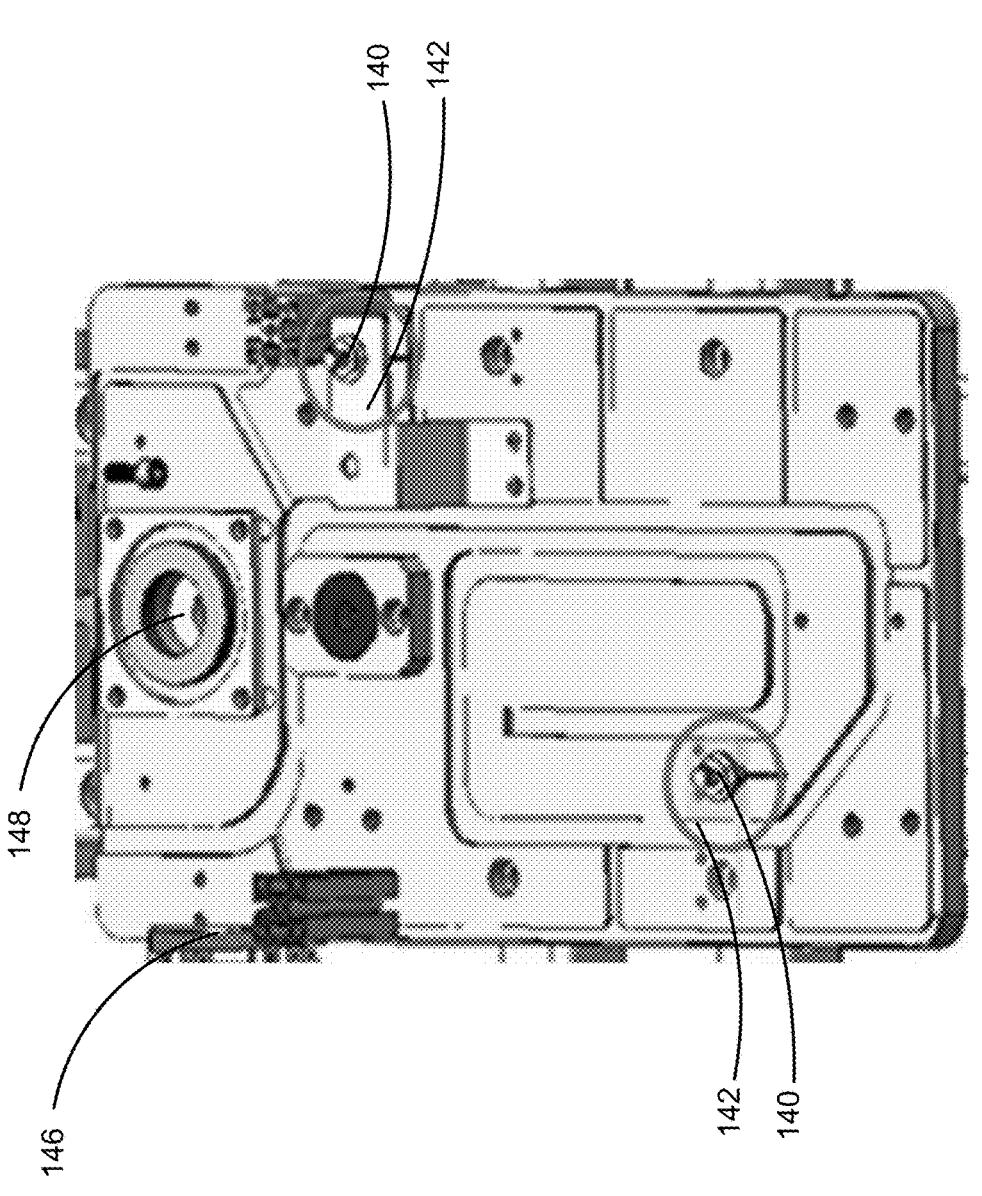
FIG. 1C

200

210
Cause one or more charging elements to extend to a charging position

200

Mobile Robot 202

214
Charge the
mobile robot

Charging
Station 100

Floor 102

200

Mobile Robot 202

Charging
Station 100

216
Determine that
charging is
complete

Floor 102

200

218
Cause the one or more charging
elements to retract to a stored
position

300

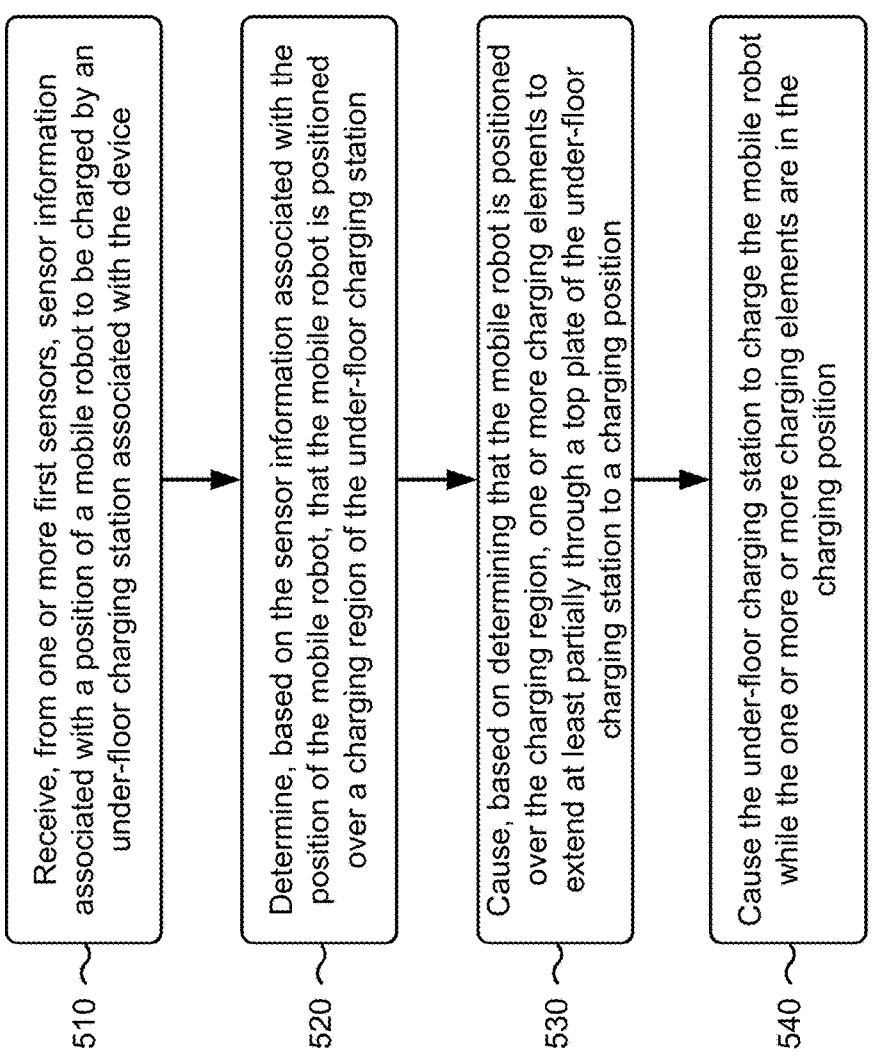

510 Receive, from one or more first sensors, sensor information associated with a position of a mobile robot to be charged by an under-floor charging station associated with the device 520 Determine, based on the sensor information associated with the position of the mobile robot, that the mobile robot is positioned over a charging region of the under-floor charging station 530 Cause, based on determining that the mobile robot is positioned over the charging region, one or more charging elements to extend at least partially through a top plate of the under-floor charging station to a charging position 540 Cause the under-floor charging station to charge the mobile robot while the one or more charging elements are in the charging position

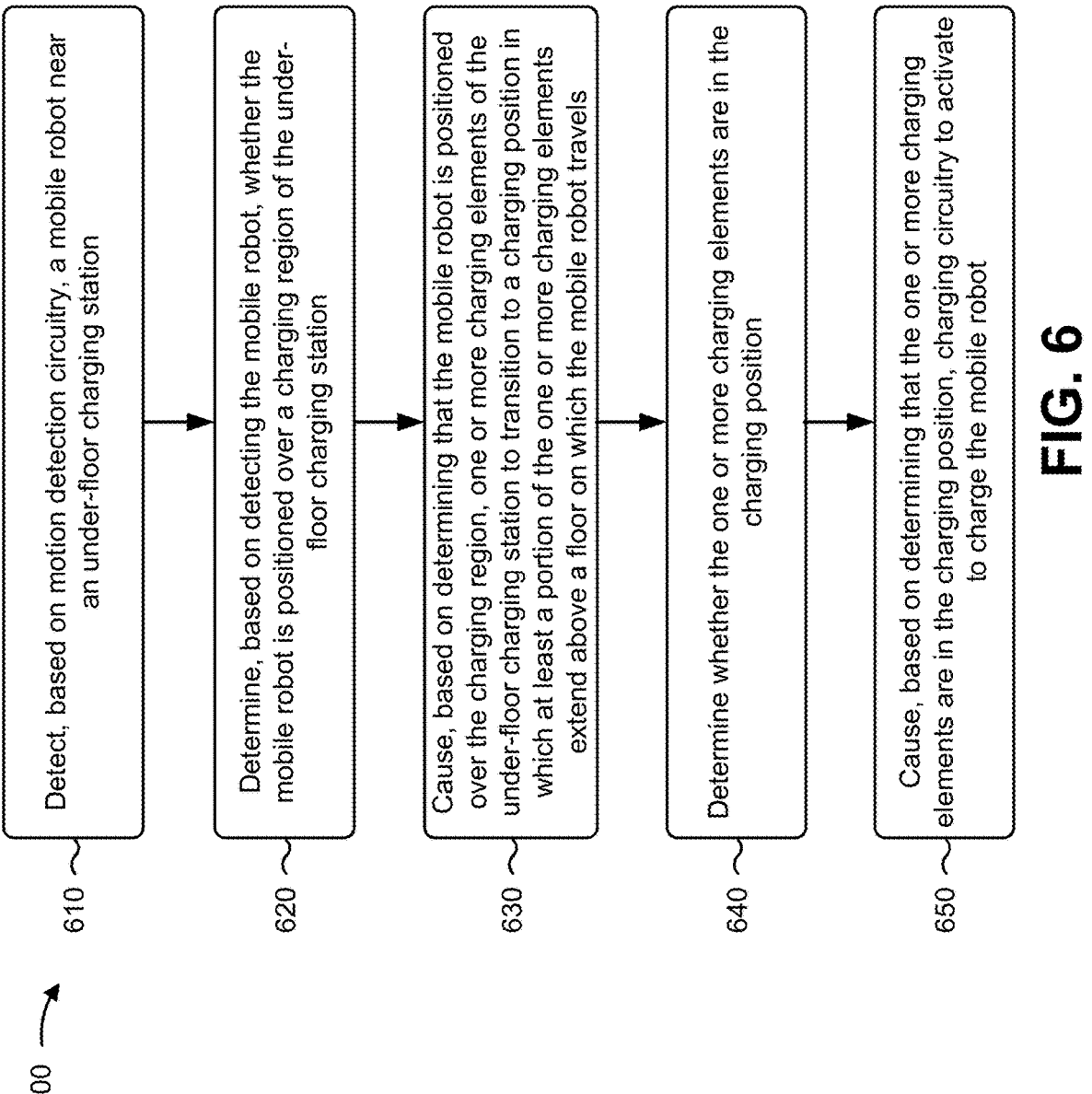

600

610 Detect, based on motion detection circuitry, a mobile robot near an under-floor charging station 620 Determine, based on detecting the mobile robot, whether the mobile robot is positioned over a charging region of the under-floor charging station 630 Cause, based on determining that the mobile robot is positioned over the charging region, one or more charging elements of the under-floor charging station to transition to a charging position in which at least a portion of the one or more charging elements extend above a floor on which the mobile robot travels 640 Determine whether the one or more charging elements are in the charging position 650 Cause, based on determining that the one or more charging elements are in the charging position, charging circuitry to activate to charge the mobile robot

FIG. 6

UNDER-FLOOR CHARGING STATION

RELATED APPLICATION

This application is a continuation of U.S. patent application Ser. No. 16/887,651, filed May 29, 2020, which is incorporated herein by reference in its entirety.

BACKGROUND

As demand for electronic devices increases, semiconductor device manufactures may continue to seek out ways of automating tasks in order to reduce costs and increase productivity. In some cases, the movement of wafers or semiconductor dies within a clean room can be at least partially automated through the use of mobile robots or other mobile transport mechanisms. In these cases, a mobile robot may transport wafers and/or dies between various semiconductor process equipment as the wafers and/or dies move through manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1G are diagrams of an example under-floor charging station described herein.

FIGS. 5-7 are flowcharts of example processes for charging a mobile robot.

DETAILED DESCRIPTION

Figure 1A:
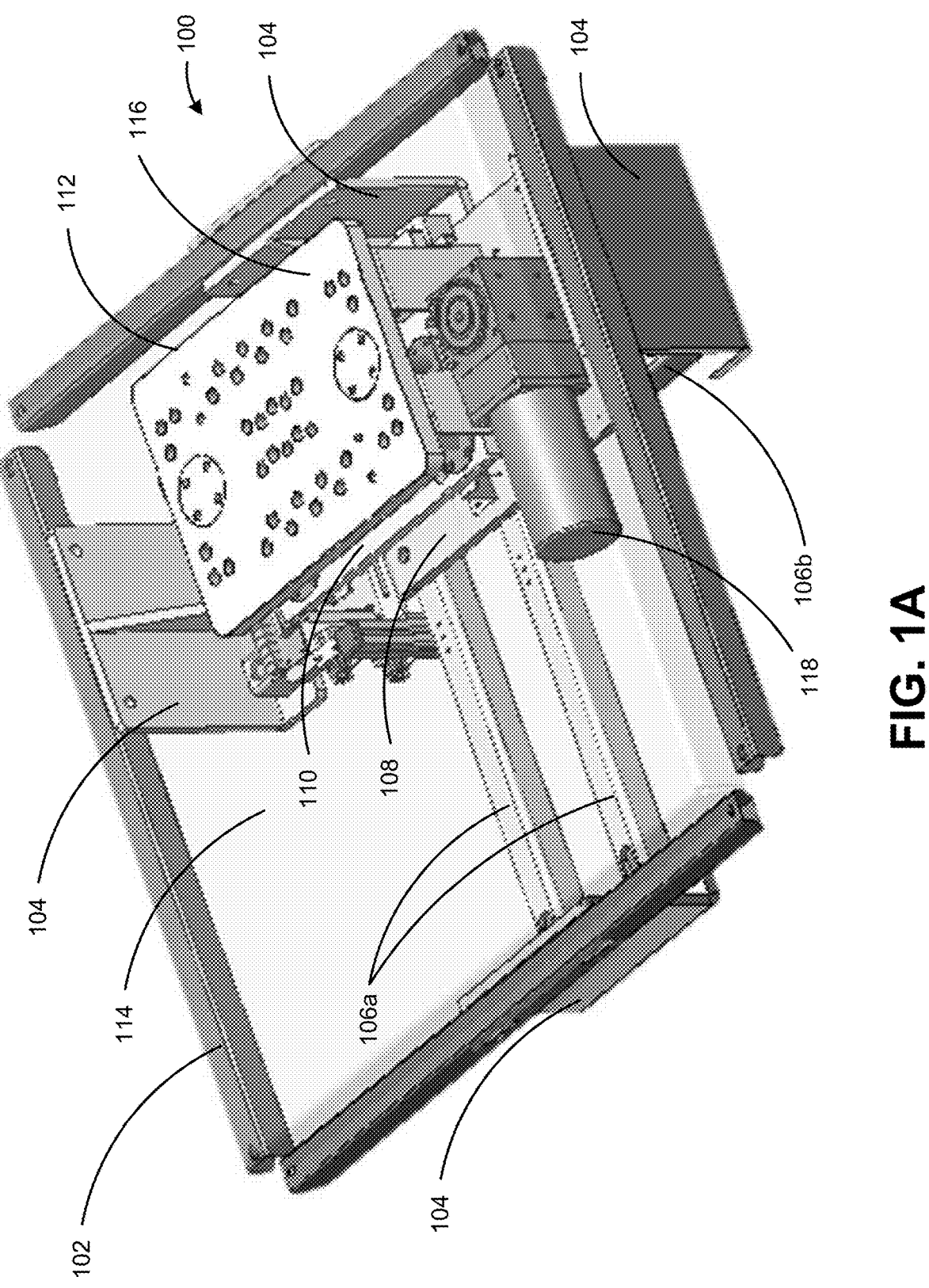

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A mobile robot can travel in a clean room to transport wafer containers and/or die containers throughout the clean room. The mobile robot may operate on battery, which permits the mobile robot to travel freely without being attached to a power cable. However, the battery will drain after prolonged use and, thus, the mobile robot will have to stop working and recharge.

Charging stations for a mobile robot can be placed throughout the clean room so that the mobile robot can charge at various locations in the clean room. However, some charging station designs have certain drawbacks. For example, some charging stations have charging rods or charging pads that protrude from the clean room floor. These protruding charging rods or charging pads may cause tripping hazards for clean room personnel, may interrupt the path of travel of the mobile robot, and may cause other issues. As another example, some charging stations are placed in the clean room in a manner which results in the mobile robot stopping productivity after a time period (e.g., 5 hours) in order to charge while idle (e.g., for an hour or more). The idle charging period results in decreased productivity of the mobile robot, decreased throughput for semiconductor processing in the clean room, and/or the like.

Some implementations described herein provide an under-floor charging station that can be mounted beneath a raised clean room floor such that a top plate of the under-floor charging station is substantially flush with the raised clean room floor without touching the ground. Openings in the top plate of the under-floor charging station allow charging elements (e.g., charging rods, charging pads, and/or other types of charging elements) to extend when in use to charge a mobile robot, and to retract under the raised clean room floor when not in use.

In this way, the retractable charging elements of the under-floor charging station prevent tripping hazards and allow the mobile robot to move freely throughout the clean room. In particular, the mobile robot can travel over the under-floor charging station without the under-floor charging station interfering with the mobile robot's path of travel. This allows the mobile robot to travel in a more direct path, which reduces the complexity in programming the path of travel of the mobile robot and allows the path of travel of the mobile robot to be more optimized. Moreover, because the charging elements can be retracted in an unobtrusive position when the under-floor charging station is not in use, the under-floor charging station is permitted to be positioned in locations in the clean room that allow the mobile robot to continue working while charging and/or allow non-stop running of the mobile robot. For example, the under-floor charging station may be positioned near wafer racks, loading ports of semiconductor processing equipment, and/or the like such that the mobile robot can charge while loading and unloading wafer/die containers.

FIGS. 1A-1G are diagrams of an example charging station 100 described herein. In some implementations, charging station 100 is a charging station for charging a battery of a mobile robot. In some implementations, charging station may be a charging station for charging other types of mobile devices that operate on battery power.

FIG. 1A shows a perspective view of charging station 100. As shown in FIG. 1A, charging station 100 may be mounted under a floor 102. In these cases, charging station 100 may be referred to as an under-floor charging station. In some implementations, floor 102 is a raised floor (e.g., in a semiconductor processing clean room, in a data center, or another type of facility having a raised floor relative to a ground or lower floor on which the raised floor is constructed) composed of a plurality of rails and floor tiles. In some implementations, floor 102 is a non-raised floor, and charging station 100 may be mounted in a cavity under the non-raised floor.

As further shown in FIG. 1A, charging station 100 may include a plurality of mounting brackets 104 to mount charging station 100 to floor 102 (e.g., to one or more rails of floor 102). Mounting brackets 104 may include various types and shapes of mounting brackets, such as L-shaped brackets, plate brackets, and/or other types of mounting brackets that are capable of sliding along one or more rails of floor 102 to permit horizontal adjustment of charging station 100. Charging station 100 may further include a plurality of support members 106 that connect and/or removably attach to mounting brackets 104. Support members 106 may include rails, tubes, or other types of support members that permit charging station 100 to horizontally translate in a plane that is parallel to floor 102. For example, charging station 100 may include one or more first support members 106a that permit charging station 100 to horizontally translate along a first axis (e.g., an X axis) in the plane that is parallel to floor 102, and may include one or more first support members 106b that permit charging station 100 to horizontally translate along a second axis (e.g., a Y axis) in the plane that is parallel to floor 102. First support member(s) 106a and second support member(s) 106b may be perpendicular or orthogonal such that the first axis and the second axis are also perpendicular or orthogonal. In this way, support members 106 permit the position of charging station 100 to be laterally adjusted within the space of a floor tile opening of floor 102.

As further shown in FIG. 1A, charging station 100 may include a bottom plate 108, a middle plate 110, and a top plate 112. Bottom plate 108, middle plate 110, and top plate 112 may be formed of various shapes, sizes, and/or materials (e.g., plastics, metals, and/or the like), and may also be referred to as trays or other types of substantially flat and planar structures. Bottom plate 108 may connect and/or removably attach to first support member(s) 106a and/or second support member(s) 106b such that the position of bottom plate 108, middle plate 110, and top plate 112 may be adjusted by sliding bottom plate 108, middle plate 110, and top plate 112 along first support member(s) 106a and/or second support member(s) 106b.

Top plate 112 may be connected and/or removably mounted onto bottom plate 108 by one or more mounting brackets or other mounting mechanisms. Top plate 112 may be connected and/or removably mounted onto bottom plate 108 such that a top surface 114 of floor 102 and a top surface 116 of top plate 112 are substantially even and/or flush to reduce and/or minimize tripping hazards and to permit a mobile robot and other mobile devices to travel over charging station 100. Middle plate 110 may be positioned between bottom plate 108 and top plate 112.

Middle plate 110 may be connected to bottom plate 108 in a manner that permits the height of middle plate 110 to be adjusted (e.g., along a Z axis or vertical axis) relative to bottom plate 108 and top plate 112. Charging station 100 may include a motor 118 to adjust the height of middle plate 110 relative to bottom plate 108 and top plate 112. Motor 118 may include various types of motors, such as a permeant magnet direct current (DC) motor, a shunt DC motor, a series DC motor, a servomotor, a brushed or brushless motor, an induction alternating current (AC) motor, and/or the like.

Figure 1B:
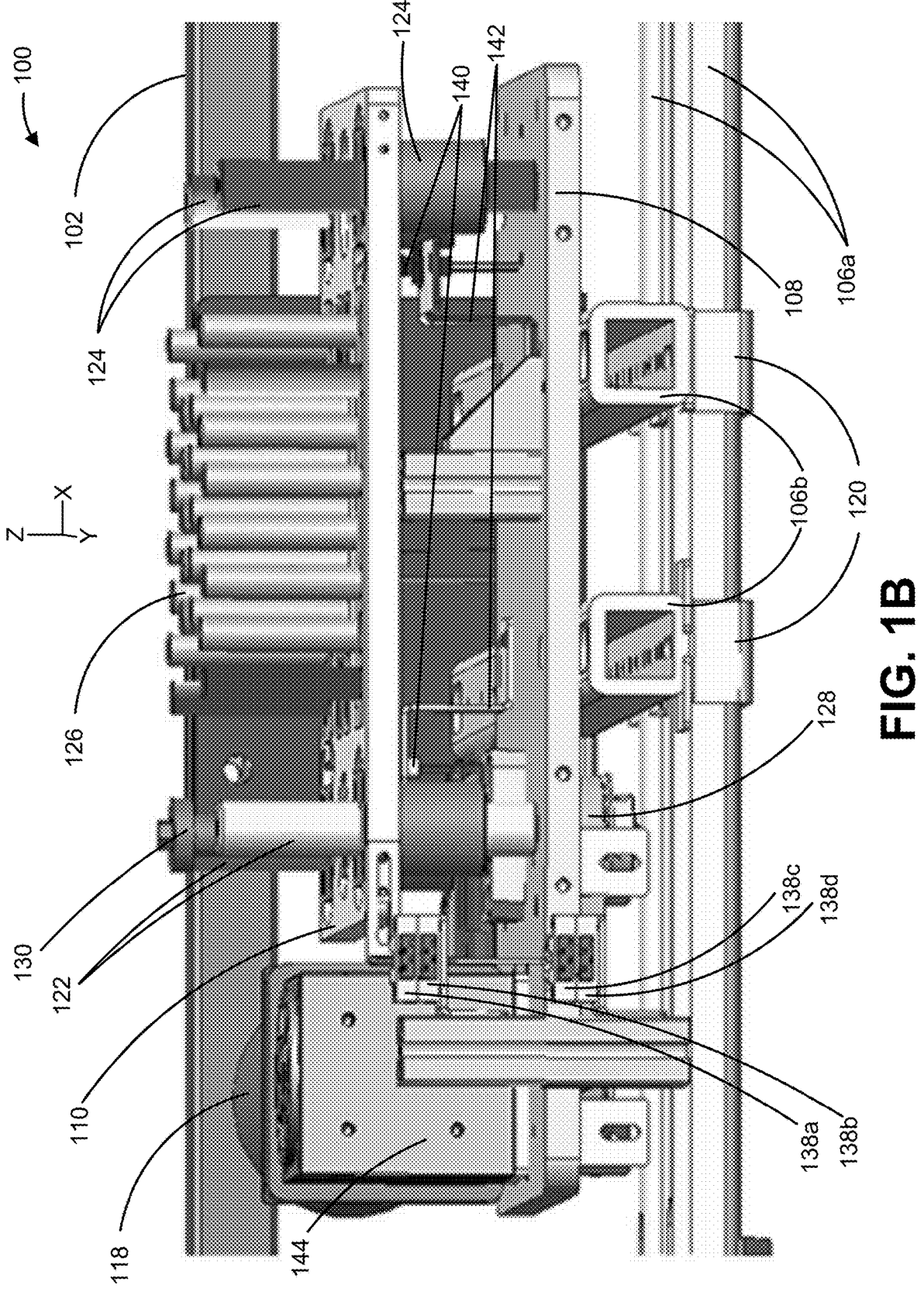

FIG. 1B shows a side view of charging station 100. As shown in FIG. 1B, charging station 100 may include one or more brackets 120. Brackets 120 may be used to connect support member(s) 106a and support member(s) 106b in a manner that permits support member(s) 106a to slide relative to support member(s) 106b and/or that permits support member(s) 106b to slide relative to support member(s) 106a. As further shown in FIG. 1B, charging station 100 may include a plurality of support members 122 that are connected and/or removably mounted to bottom plate 108. Support members 122 may be rods, tubes, rails and/or other types of elongated members that are positioned substantially perpendicular to bottom plate 108, middle plate 110, and top plate 112. Middle plate 110 may slide along support members 122 in a manner that changes the height and/or the vertical position (e.g., along a Z axis or vertical axis) of middle plate 110 relative to bottom plate 108 and top plate 112. Middle plate 110 may be slidably interfaced with support members 122 by a plurality of friction rings 124 that are removably attached to middle plate 110. Friction rings 124 may include linear bearings, plastic or polymer cylindrical sleeves, or other types of components that reduce friction and/or decrease wear as middle plate 110 slides along support members 122.

As further shown in FIG. 1B, charging station 100 may include one or more charging elements 126 on middle plate 110. In some implementations, charging element(s) 126 may be connected and/or removably or irremovably mounted on middle plate 110. Accordingly, movement of middle plate 110 along support members 122 may change the height and/or the vertical position of charging element(s) 126 along with the height and/or the vertical position of middle plate 110. In this way, middle plate 110 may slide along support members 122 to extend at least a portion of charging element(s) 126 above top surface 114 of floor 102 and/or to retract charging element(s) 126 below or even with top surface 114 of floor 102.

Charging element(s) 126 may include charging rods, charging pads, charging prongs, or other types of structures that may be used to charge a mobile robot. Charging element(s) 126 may extend upward toward top plate 112 and may be formed of various conductive materials, such as copper, gold, silver, and/or the like, to carry an electrical current. The quantity, size, shape, and/or configuration of charging element(s) 126 illustrated in FIGS. 1A-1G are provide as an example only and, in practice, may be based on the mobile robot and other mobile devices that are to be charged by charging station 100.

As further shown in FIG. 1B, charging station 100 may include various means for adjusting the height and/or the vertical position of middle plate 110 (and thus, the height and/or the vertical position of charging element(s) 126). For example, charging station 100 may include linkage 128 and a turning member 130. Linkage 128 may mechanically connect motor 118 to turning member 130. Linkage 128 may include various gears, shafts, and/or other types of mechanical components that transfer rotational motion of motor 118 to rotational motion of turning member 130. Turning member 130 may be a threaded rod or threaded shaft that rotates to adjust the height and/or the vertical position of middle plate 110 (and thus, the height and/or the vertical position of charging element(s) 126).

As further shown in FIG. 1B, charging station 100 may include a plurality of sensors 138. Sensors 138 may be position sensors for detecting the height or the vertical position (e.g., along the Z axis) of middle plate 110. Sensors 138 may include proximity sensors, photodetectors, Hall effect sensors, reflective fibro sensors, linear variable differential transformers (LVDTs), and/or other types of sensors that are capable of detecting the height or the vertical position of middle plate 110, that are capable of generating sensor information or sensor data based on the height or the vertical position of middle plate 110, and/or the like.

In some implementations, each of sensors 138 may be positioned and/or otherwise configured to detect and/or generate sensor information based on a particular height or vertical position of middle plate 110. For example, sensor 138*a* may be positioned and/or otherwise configured to detect an upper position limit of middle plate 110, to generate sensor information based on an upper position limit of middle plate 110, and/or the like. The upper position limit may correspond to the maximum permitted height or vertical position of middle plate 110. As another example, sensor 138*b* may be positioned and/or otherwise configured to detect a charging position of middle plate 110, generate sensor information based on a charging position of middle plate, and/or the like. The charging position may be a particular height, height range, vertical position, or vertical position range of middle plate 110 at which at least a portion of charging element(s) 126 are extended above top surface 114 of floor 102 to permit charging of a mobile robot.

As another example, sensor 138*c* may be positioned and/or otherwise configured to detect a stored position of middle plate 110, generate sensor information based on a stored position of middle plate 110, and/or the like. The stored position may be a particular height, height range, vertical position, or vertical position range of middle plate 110 at which charging element(s) 126 are retracted below or even with top surface 114 of floor 102 such that charging element(s) 126 are not a tripping hazard and do not interfere with travel of a mobile robot. As another example, sensor 138*d* may be positioned and/or otherwise configured to detect a lower position limit of middle plate 110, to generate sensor information based on a lower position limit of middle plate 110, and/or the like. The lower position limit may correspond to the minimum permitted height or vertical position of middle plate 110.

As further shown in FIG. 1B, charging station 100 may include one or more sensors 140. Sensor(s) 140 may be mounted and/or removably attached to bottom plate 108, for example, by brackets 142. Sensor(s) 140 may be configured to detect motion near charging station 100, may be configured to generate sensor information associated with a horizontal position or lateral position (e.g., a horizontal position or lateral position along an X axis and a Y axis) of a mobile robot, and/or the like. Sensor(s) 140 may include proximity sensors, photodetectors, Hall effect sensors, reflective fibro sensors, LVDTs, and/or other types of sensors that are capable of detecting motion near charging station 100, that are capable of generating sensor information or sensor data associated with a horizontal position or lateral position of a mobile robot, and/or the like.

As further shown in FIG. 1B, charging station 100 may include a controller housing 144. Controller housing 144 may include a metal housing, a plastic housing, or another type of housing configured to protect various electrical and electromechanical components included in charging station 100, such as a controller, various types of motion detection circuitry, various types of charging circuitry, and/or the like.

FIG. 1C shows a perspective view of bottom plate 108. As shown in FIG. 1C, sensor(s) 140 may be mounted and/or removably attached to bottom plate 108, for example, by brackets 142 or another type of support structure. As further shown in FIG. 1C, sensors 138 may be mounted and/or removably attached to bottom plate 108, for example, by a bracket 146 or another type of support structure. As further shown in FIG. 1C, an opening 148 may be formed through bottom plate 108 in which turning member 130 may be supported and may mechanically connect with linkage 128.

Figure 1D:
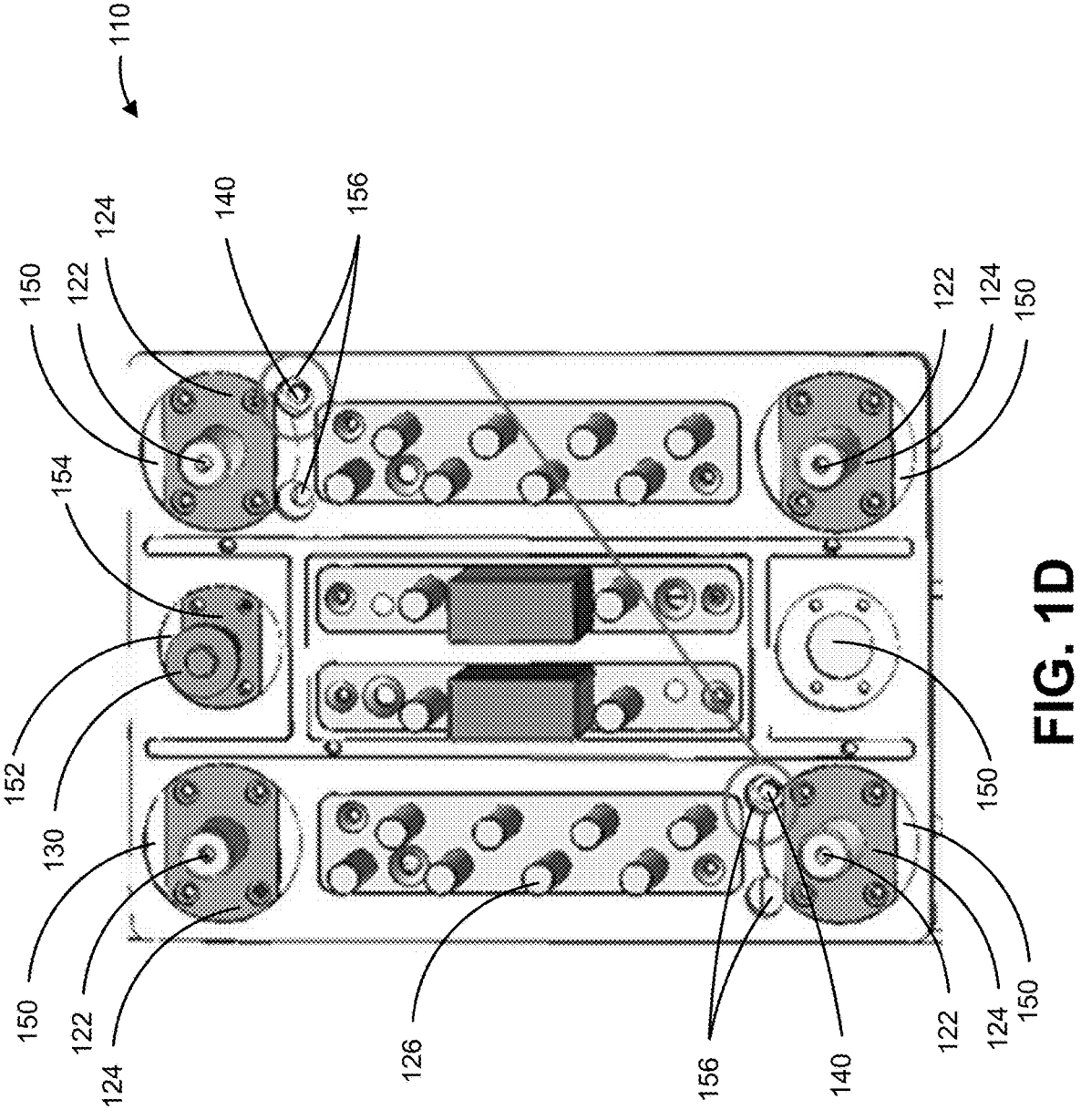

FIG. 1D shows a top-down view of middle plate 110. As shown in FIG. 1D, one or more sections of charging element(s) 126 may be positioned on middle plate 110. In some implementations, charging element(s) 126 are removably attached to middle plate 110 by various types of fastening mechanisms, such as screws, rivets, brackets, clips, and/or the like. In some implementations, charging element(s) 126 are integrated into middle plate 110.

As further shown in FIG. 1D, various openings may be formed through middle plate 110. For example, openings 150 may be formed through middle plate 110 to permit support members 122 to be positioned through openings 150. Moreover, friction rings 124 may be positioned in openings 150 such that support members 122 are inserted through friction rings 124. As another example, an opening 152 may be formed through middle plate 110 to permit turning member 130 to be positioned through opening 152. In some implementations, a plurality of openings 152 may be formed through middle plate 110 to permit various configurations of adjustment mechanisms to be used with middle plate 110 for adjusting the height or vertical position of middle plate 110. A support structure 154 may be positioned and/or removably attached in opening 152 to support and/or interface with turning member 130. Support structure 154 may include a threaded opening to interface with the threads of turning member 130 such that rotation of turning member 130 causes the threads of turning member 130 and the threads of support structure 154 to move middle plate 110 along a vertical axis or Z axis.

As further shown in FIG. 1D, one or more openings 156 may be formed through middle plate 110 to permit sensor(s) 140 to detect motion near charging station 100, to generate sensor information associated with a horizontal position or lateral position of a mobile robot, and/or the like through middle plate 110. In some implementations, a plurality of openings 156 may be formed through middle plate 110 to permit various configurations and/or types of sensor(s) 140 to be used with charging station 100.

Figures 1E, 1F:
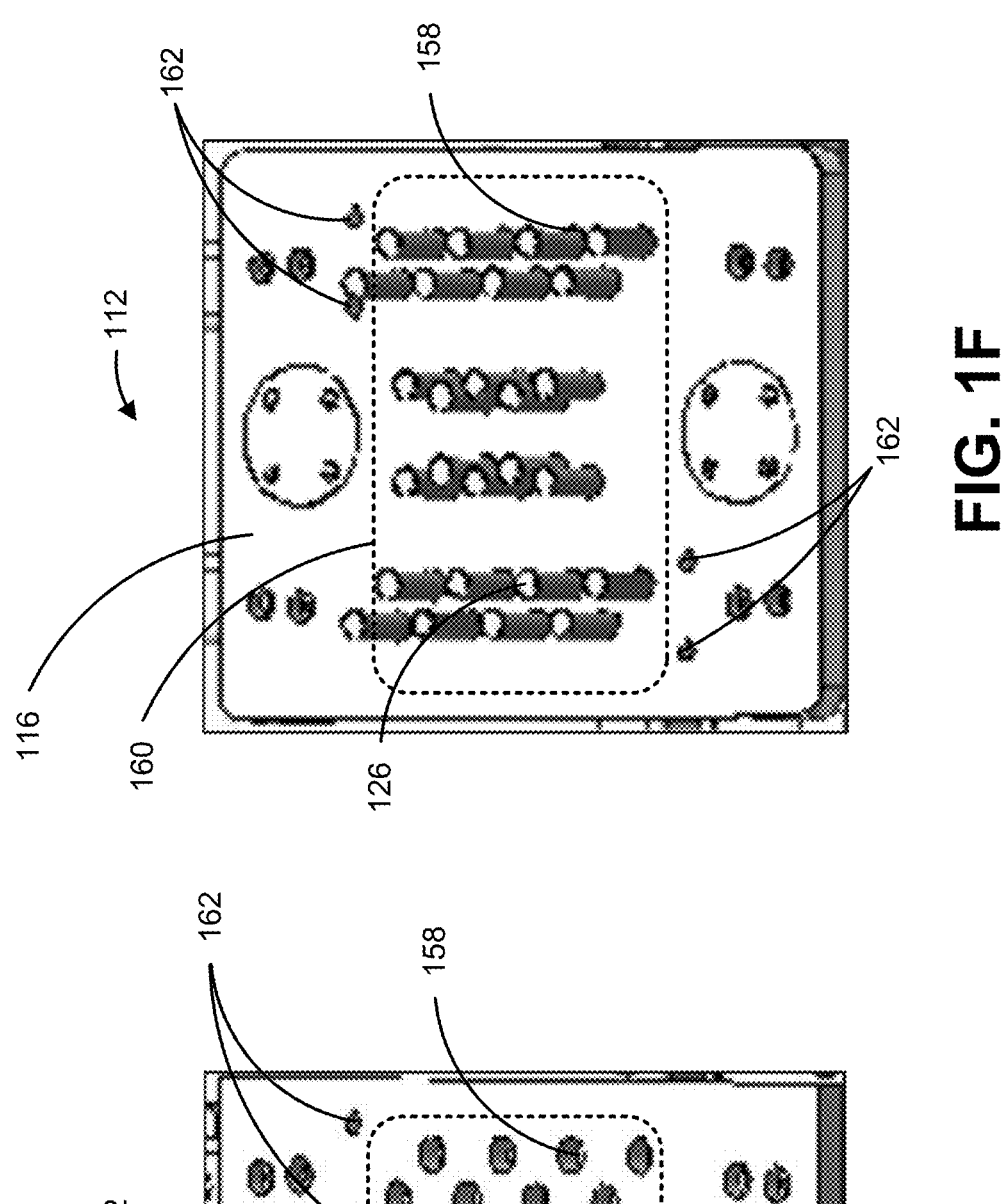

FIGS. 1E and 1F respectively show perspective views of top plate 112. As shown in FIGS. 1E and 1F, a plurality of openings may be formed through top plate 112. For example, one or more openings 158 may be formed through top plate 112 through which charging element(s) 126 may extend and retract through top plate 112. Opening(s) 158 may be located in a charging region 160 of charging station 100 and/or of top plate 112. Charging region 160 may be a region in which the transfer of electrical charge or electrical current between charging element(s) 126 and a mobile robot primarily occurs. As another example, one or more openings 162 may be formed through top plate 112 to permit sensor(s) 140 to detect motion near charging station 100, to generate sensor information associated with a horizontal position or lateral position of a mobile robot, and/or the like through top plate 112. In some implementations, a plurality of openings 162 may be formed through top plate 112 to permit various configurations and/or types of sensor(s) 140 to be used with charging station 100. In some implementations, the quantity of openings 156 and the quantity of openings 162 may be the same quantity of openings. In some implementations, the quantity of openings 156 and the quantity of openings 162 may be different quantities of openings.

Moreover, FIGS. 1E and 1F respectively show a stored configuration of charging station 100 and a charging configuration of charging station 100. As shown in FIG. 1E, in the stored configuration, charging element(s) 126 are retracted through openings 158 in top plate 112 such that charging element(s) 126 are positioned even with or below top surface 116 of top plate 112 (and thus, even with or below top surface 114 of floor 102). The stored position may correspond to a height or vertical position of middle plate 110 detected based on sensor information generated by sensor 138c. As shown in FIG. 1F, in the charging configuration, at least a portion of charging element(s) 126 are extended through openings 158 in top plate 112 and are above top surface 116 of top plate 112 (and thus, above top surface 114 of floor 102). The charging position may correspond to a height or vertical position of middle plate 110 detected based on sensor information generated by sensor 138b.

Figure 1G:
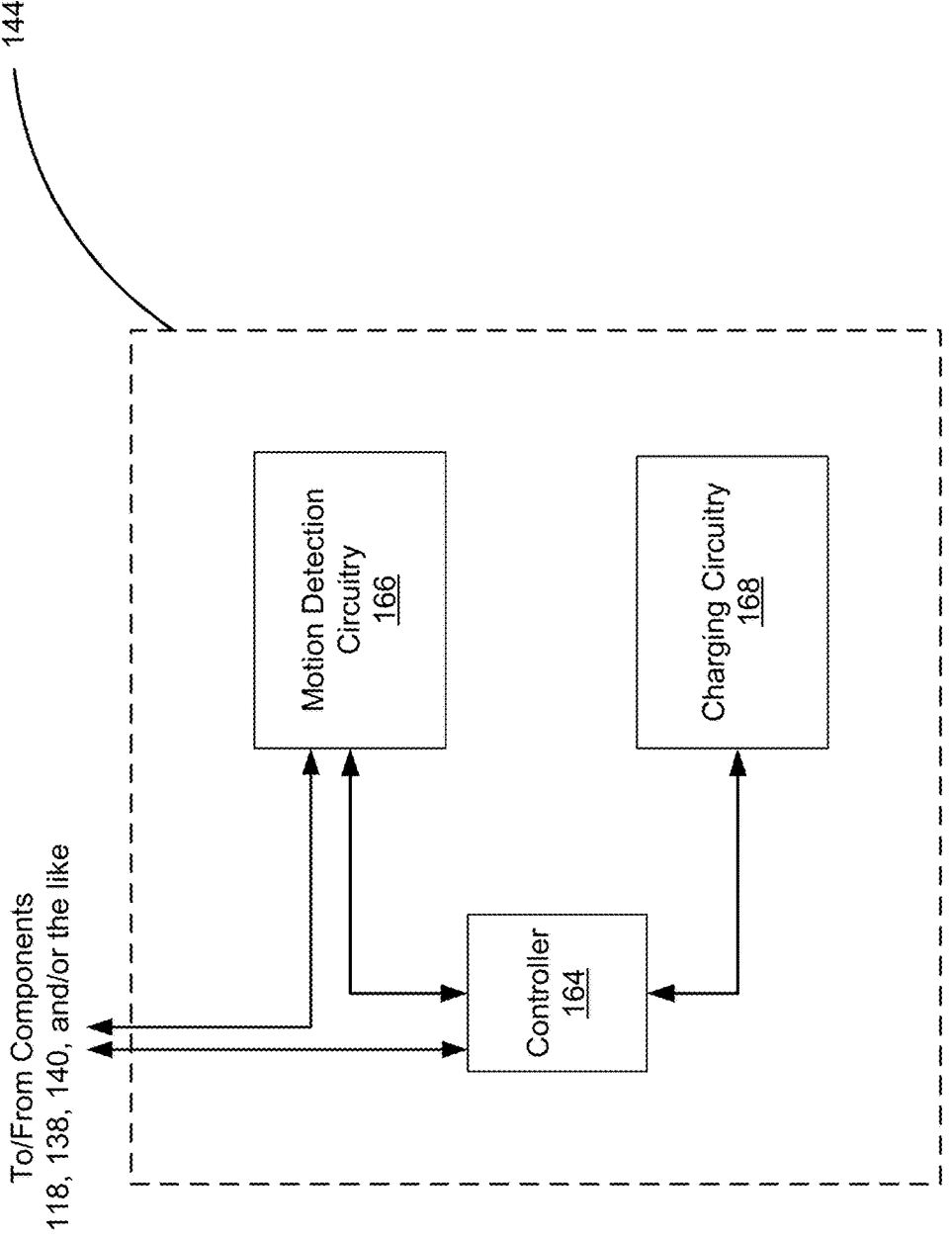

FIG. 1G shows the various electrical and electromechanical components included in controller housing 144. As shown in FIG. 1G, charging station 100 may include a controller 164, motion detection circuitry 166, charging circuitry 168, and/or one or more other electrical and electromechanical components. As shown in FIG. 1G, controller 164 may communicate with various components of charging station 100, including motor 118, sensors 138, sensor(s) 140, motion detection circuitry 166, charging circuitry 168, and/or the like.

Controller 164 may include a programmable logic controller (PLC), a microcontroller, and/or another type of electronic controller capable of communicating with various components of charging station 100, capable of receiving, generating, and processing electronic information, capable of transmitting instructions and/or causing the various components of charging station 100 to perform various types of actions, and/or the like. For example, controller 164 may communicate with motor 118 to cause motor 118 to activate and deactivate to adjust the height or vertical position of middle plate 110. As another example, controller 164 may communicate with sensors 138 to receive sensor information associated with the height or vertical position of middle plate 110 and may cause motor 118 to activate or deactivate based on the sensor information. As another example, controller 164 may communicate with sensor(s) 140 to receive sensor information associated with detecting a mobile robot near charging station 100 (e.g., near charging region 160 of top plate 112), to receive sensor information associated with a position of the mobile robot relative to charging station 100 (e.g., relative to charging region 160 of top plate 112), and/or the like, and may cause motor 118 to activate or deactivate based on the sensor information.

As another example, controller 164 may communicate with motion detection circuitry 166 to receive an indication that a mobile robot has been detected near charging station 100 (e.g., near charging region 160 of top plate 112). For example, motion detection circuitry 166 may include a motion detection relay that activates or energizes a motion detection circuit included in motion detection circuitry 166. The motion detection relay may activate or energize the motion detection circuit based on receiving, from sensor(s) 140, an indication that the mobile robot has been detected near charging station 100 (e.g., near charging region 160 of top plate 112). The indication may be a change in voltage that closes or opens the motion detection relay, a change in current that opens or closes the motion detection relay, and/or the like. Closing or opening the motion detection relay may cause the motion detection circuit to be activated or energized. The controller 164 may determine that the motion detection circuit has been activated or energized and may determine that the mobile robot has been detected near charging station 100 (e.g., near charging region 160 of top plate 112) based on the motion detection circuit being activated or energized. In these cases, controller 164 may communicate with sensor(s) 140, based on determining that the mobile robot has been detected near charging station 100 (e.g., near charging region 160 of top plate 112), to receive sensor information associated with the position of the mobile robot relative to charging station 100 (e.g., relative to charging region 160 of top plate 112).

As another example, controller 164 may communicate with charging circuitry 168 to cause the mobile robot to be charged by charging station 100. For example, charging circuitry 168 may include a charging relay that activates or energizes a charging circuit included in charging circuitry 168. Controller 164 may cause the charging relay to be opened or closed based on the sensor information received from sensor(s) 138. For example, controller 164 may determine, based on the sensor information, that middle plate 110 (and thus, charging element(s) 126) is in the charging position. Controller 164 may cause, based on determining that middle plate 110 is in the charging position, the charging relay to be opened or closed to activate the charging circuit to cause the mobile robot to be charged.

As indicated above, FIGS. 1A-1G are provided as one or more examples. Other examples may differ from what is described with regard to FIGS. 1A-1G.

FIGS. 2A-2G are diagrams of one or more example implementations 200 described herein. Example implementation(s) 200 illustrate various techniques and/or actions for charging a battery of a mobile robot 202 using charging station 100. In some implementations, the various techniques and/or actions described in connection with example implementation(s) 200 may be used to charge other types of mobile devices that operate on battery power.

Figure 2A:
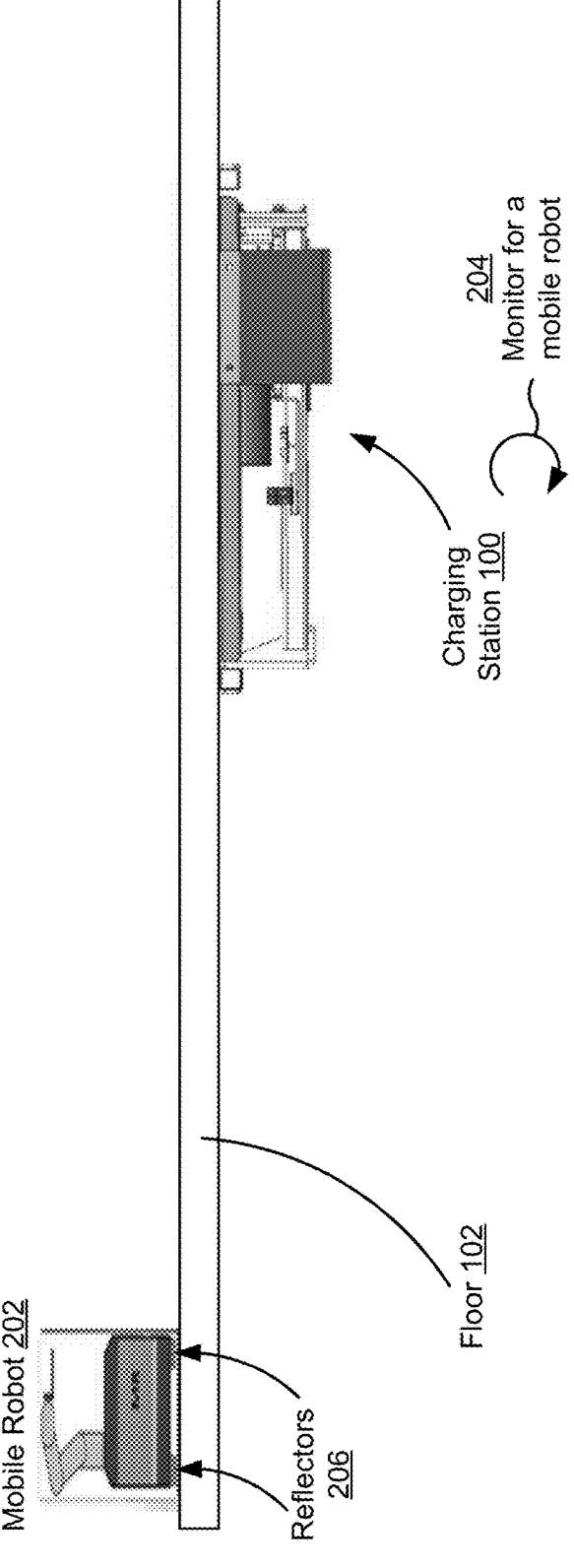
FIGS. 2A-2G are diagrams of one or more example implementations described herein.

As shown in FIG. 2A, and by reference number 204, charging station 100 may monitor for a mobile robot. In some implementations, charging station 100 monitors for a mobile robot (e.g., mobile robot 202) using various components of charging station 100, such as sensor(s) 140, controller 164, motion detection circuitry 166, and/or the like. For example, sensor(s) 140 may include one or more reflective fiber sensors. A reflective fiber sensor (of sensor 140) may emit light (e.g., visible light, infrared light, and/or the like) and may measure an amount of reflected light received at the reflective fiber sensor.

Accordingly, mobile robot 202 may be equipped with one or more reflectors 206 at or near the bottom of mobile robot 202 configured to reflect the light emitted from sensor(s) 140. A sensor 140 may generate a voltage, an electrical current, or another type of sensor information corresponding to the amount of reflected light received at the sensor 140. The sensor 140 may provide the voltage, the electrical current, or another type of sensor information to controller 164 and/or motion detection circuitry 166. In some implementations, controller 164 detects the presence of mobile robot 202 near charging station 100 based on determining that a voltage provided by at least one sensor 140 satisfies a threshold voltage, based on determining that an electrical current provided by at least one sensor 140 satisfies a threshold electrical current, and/or the like.

In some implementations, controller 164 detects the presence of mobile robot 202 near charging station 100 based on activation or energization of a motion detection circuit of motion detection circuitry 166. For example, sensor(s) 140 may provide the voltage, the electrical current, or another type of sensor information to a motion detection relay of motion detection circuitry 166. The motion detection relay may open or close based on the voltage satisfying a threshold voltage to open or close the motion detection relay, based on the electrical current satisfying a threshold voltage to open or close the motion detection relay, and/or the like. Opening or closing of the motion detection relay may activate or energize the motion detection circuit, which indicates to controller 164 the presence of mobile robot 202 near charging station 100.

Figure 2B:
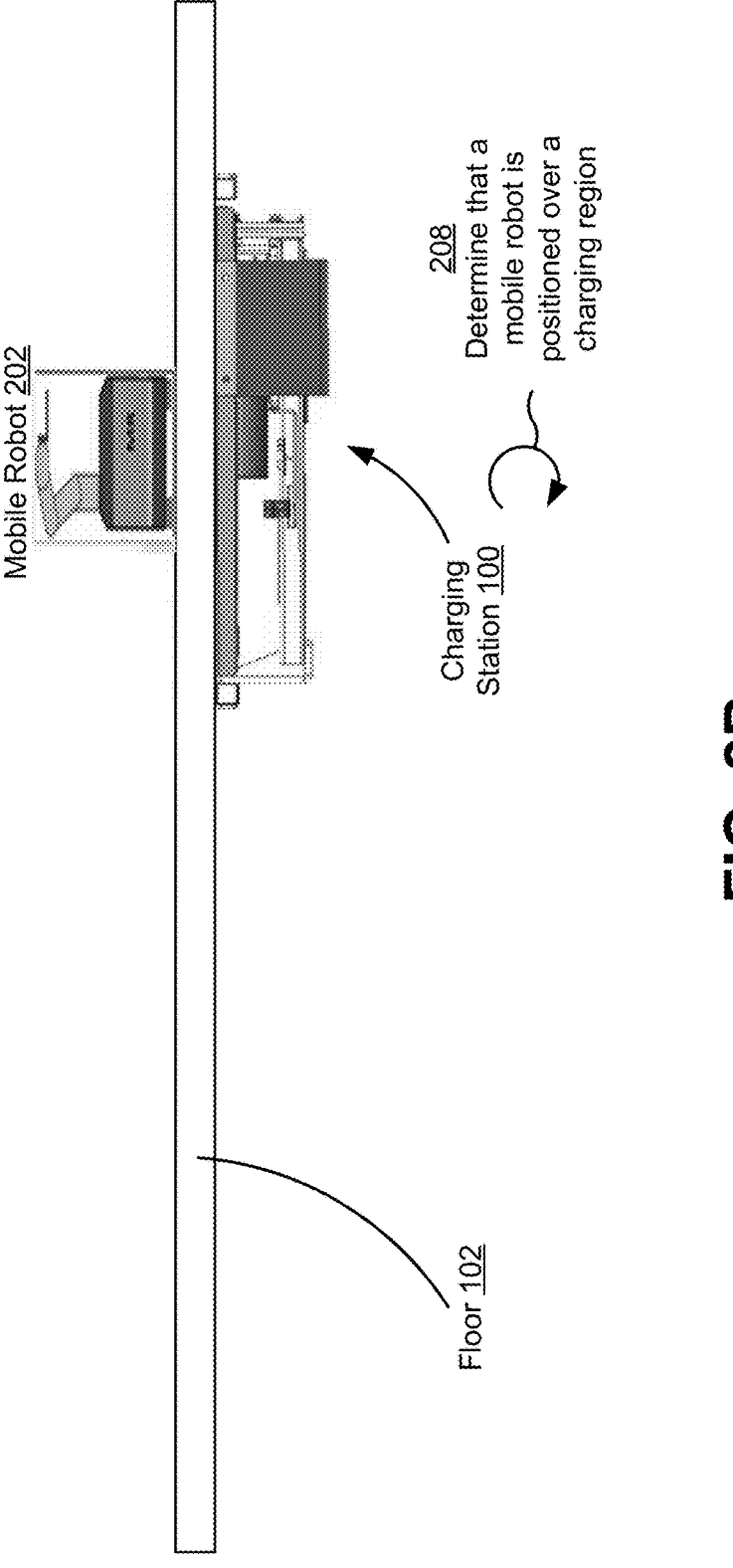

As shown in FIG. 2B, and by reference number 208, charging station 100 may determine that a mobile robot (e.g., mobile robot 202) is positioned over charging region 160 of top plate 112 of charging station 100. Charging station 100 may use various components to determine that mobile robot 202 is positioned over charging region 160, such as sensor(s) 140, controller 164, and/or the like. For example, mobile robot 202 may travel along floor 102 and over charging station 100 (e.g., over top plate 112). Charging station 100 may be mounted under floor 102 such that top surface 114 of floor 102 and top surface 116 of top plate 112 are substantially even or flush, thereby permitting mobile robot 202 to travel over top plate 112. Sensor(s) 140 may include a plurality of sensors, where each sensor is positioned and/or configured to generate sensor information based on reflected light from a respective reflector 206 on mobile robot 202. The sensors 140 may be positioned around charging region 160 such that, when mobile robot 202 is in a position to be charged over charging region 160, controller 164 may determine that a threshold amount of reflected light is detected at all of the sensors 140. Accordingly, if controller 164 determines that a threshold amount of reflected light is detected at all of the sensors 140, controller 164 may determine that mobile robot 202 is positioned over charging region 160 for charging by charging station 100. In some implementations, if controller 164 determines that mobile robot 202 is not positioned over charging region 160 but within a threshold range (e.g., an X-axis range and/or a Y-axis range) of being positioned over charging region 160, controller 164 may cause the position of charging station 100 to be adjusted (e.g., by sliding charging station 100 along support members 106) such that mobile robot 202 is positioned over charging region 160

Figure 2C:
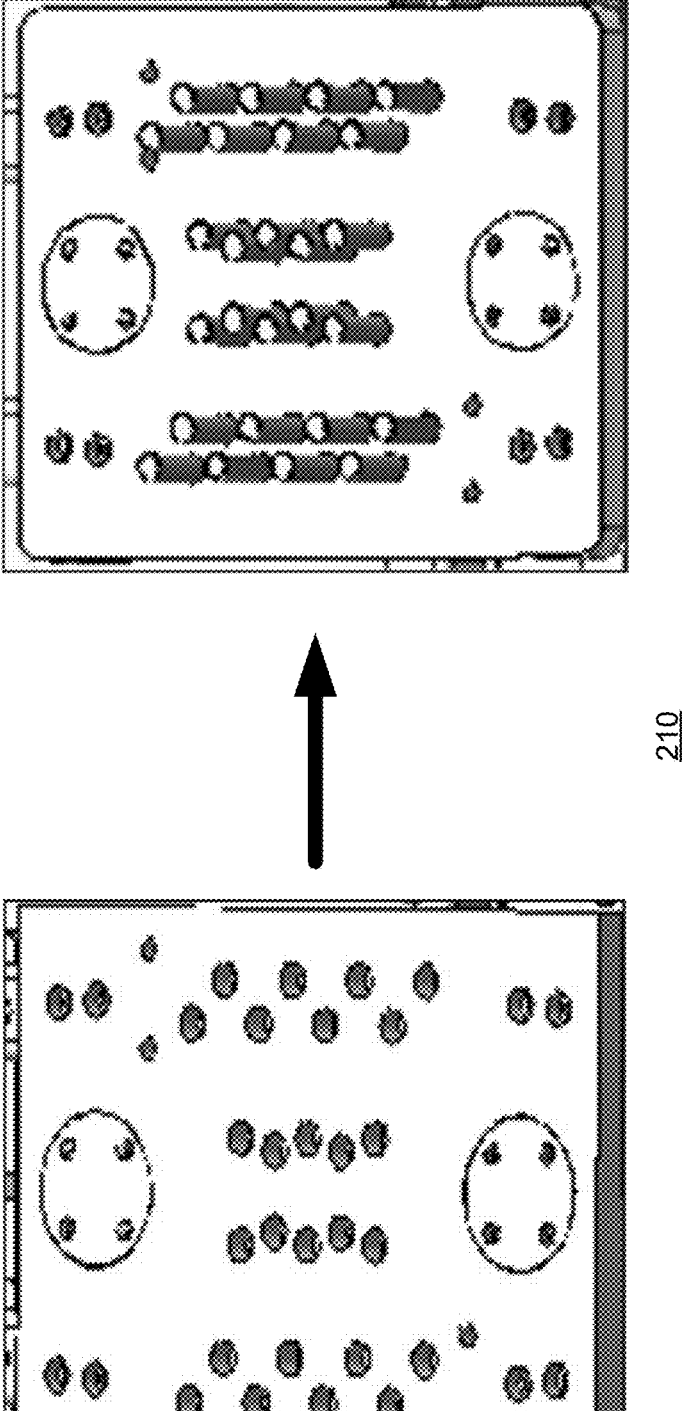

As shown in FIG. 2C, and by reference number 210, charging station 100 may cause charging element(s) 126 to extend to a charging position for charging mobile robot 202. Charging station 100 may cause charging element(s) 126 to extend to the charging position based on determining that mobile robot 202 is positioned over charging region 160 for charging. Charging station 100 may use various components to cause charging element(s) 126 to extend to the charging position, such as motor 118, sensors 138, turning member 130, controller 164, and/or the like. For example, controller 164 may receive, from sensor 138c, sensor information indicating a position of middle plate 110 on which charging element(s) 126 are positioned. The sensor information may indicate that middle plate 110 (and thus, charging element(s) 126) is in a stored position, in which charging element(s) 126 are positioned even with or below top surface 116 of top plate 112. Accordingly, controller 164 may transmit a signal or instruction to motor 118 to activate motor 118. Motor 118 may cause, though linkage 128, turning member 130 to rotate in a direction that causes the height or vertical position of middle plate 110 to increase, thereby causing middle plate

110 (and thus, charging element(s) 126) to transition from the stored position to a charging position.

Figure 2D:
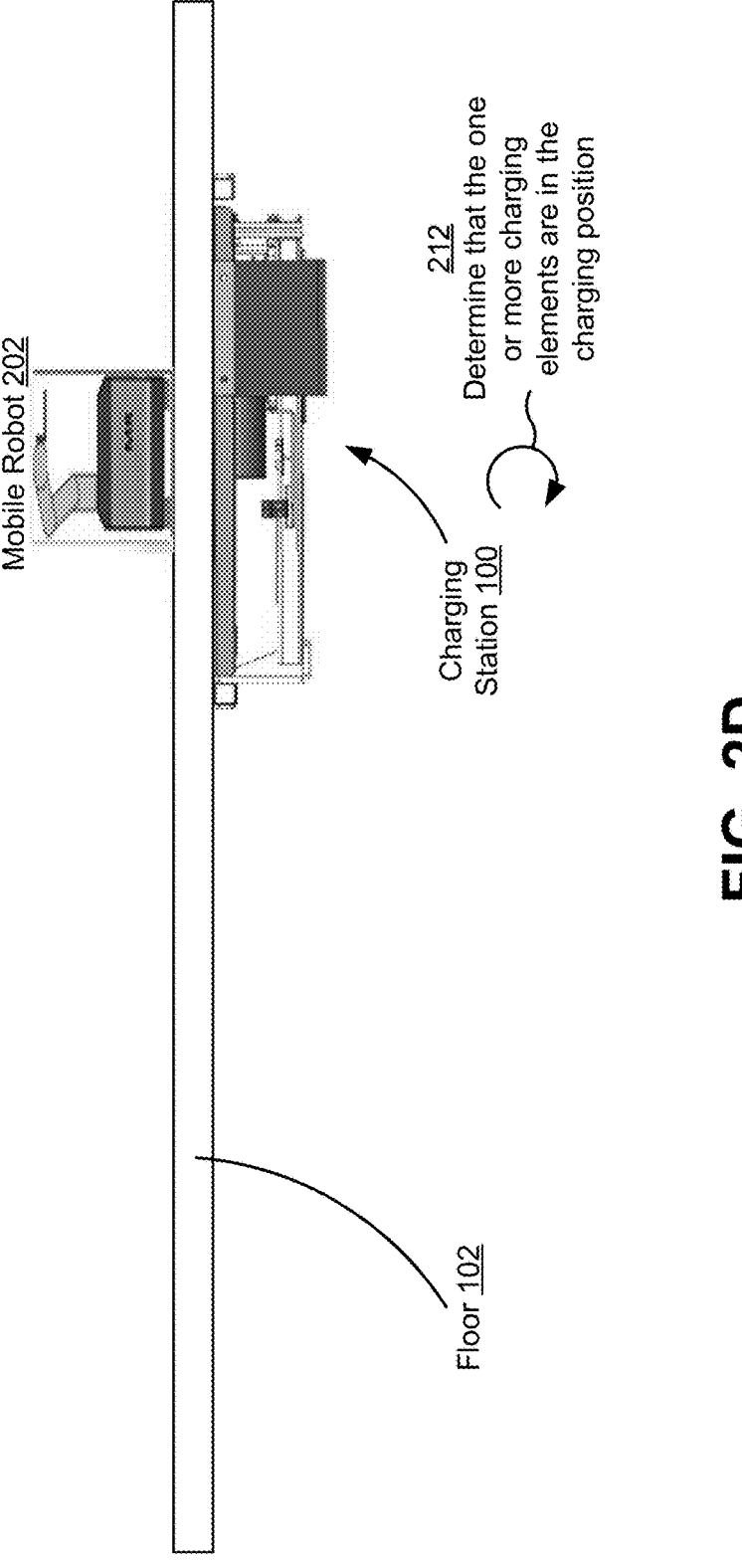

As shown in FIG. 2D, and by reference number 212, charging station 100 may determine that middle plate 110 (and thus, charging element(s) 126) is in the charging position. Charging station 100 may use various components to determine that middle plate 110 (and thus, charging element(s) 126) is in the charging position, such as sensors 138, controller 164, and/or the like. Controller 164 may receive, from sensor 138b, sensor information indicating that middle plate 110 (and thus, charging element(s) 126) has reached the charging position. In the charging position, at least a portion of charging element(s) 126 extend through openings 158 in top plate 112 such that the portion of charging element(s) 126 extend above top surface 116 of top plate 112 and top surface 114 of floor 102. Moreover, in the charging position, at least a portion of charging element(s) 126 contact charging element(s) of mobile robot 202 such that an electrical charge and/or an electrical current may be transferred between charging element(s) 126 and the charging element(s) of mobile robot 202. Controller 164 may cause, based on receiving the sensor information indicating that middle plate 110 (and thus, charging element(s) 126) has reached the charging position, motor 118 to deactivate and to cease causing turning member 130 to increase the height or vertical position of middle plate 110.

Figure 2E:
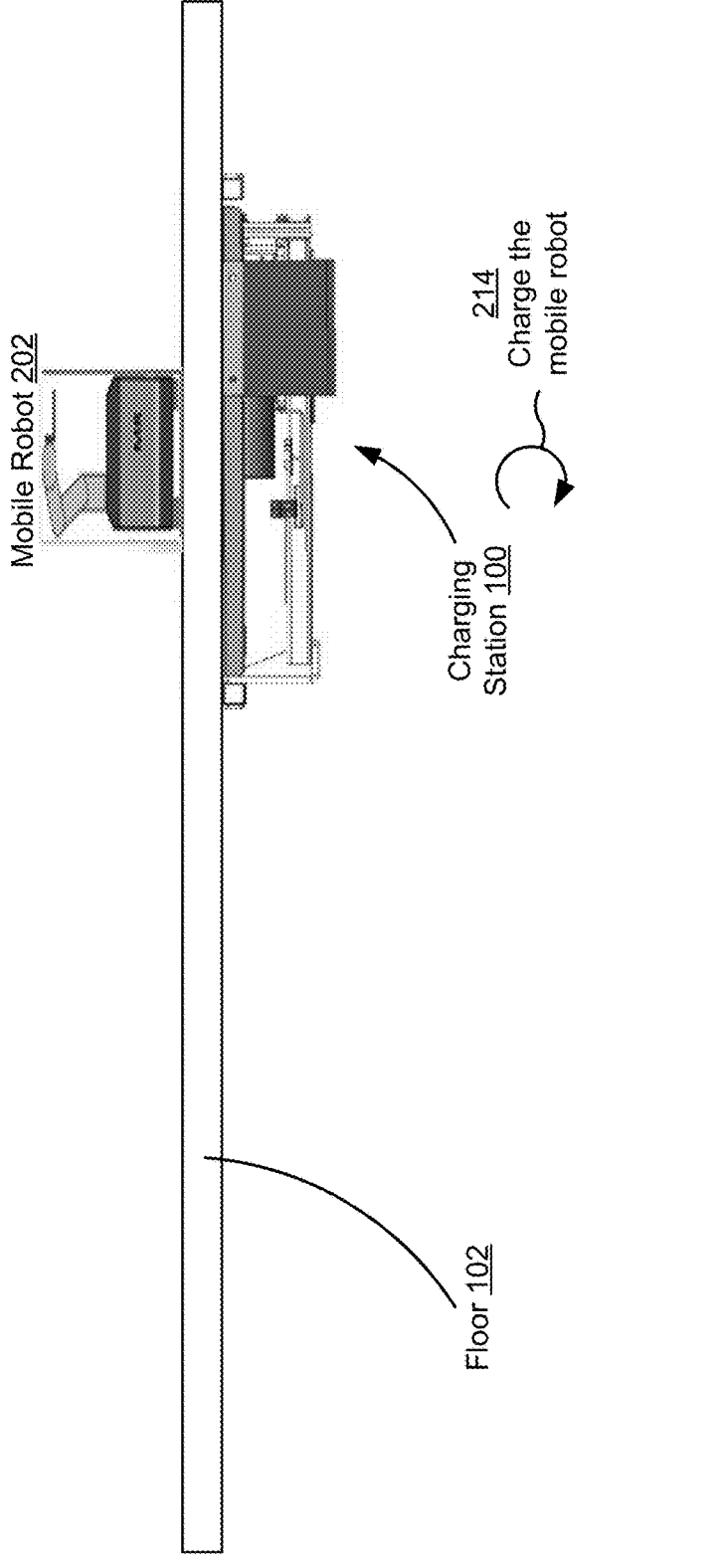

As shown in FIG. 2E, and by reference number 214, charging station 100 may charge mobile robot 202. Charging station 100 may charge mobile robot 202 by causing an electrical charge or an electrical current to be transferred from charging element(s) 126 to the battery of mobile robot 202 through the charging element(s) of mobile robot 202. Charging station 100 may use various components to charge mobile robot 202, including charging element(s) 126, controller 164, charging circuitry 168, and/or the like. For example, mobile robot 202 may communicate with controller 164 through a communication interface of controller 164 to initiate charging. In some implementations, mobile robot 202 may initiate charging by transmitting, to controller 164, an instruction to cause mobile robot 202 to be charged.

In some implementations, a communication path is established between controller 164 and mobile robot 202 when mobile robot 202 is positioned over charging region 160. For example, charging station 100 may include a communication connector that connects with a communication connector of mobile robot 202 when charging element(s) 126 extend to the charging position. In these cases, controller 164 and mobile robot 202 may communicate via the communication path. In some implementations, controller 164 and mobile robot 202 communicate wirelessly by transmitting wireless signals via a wireless communication channel.

Controller 164 may begin the charging of mobile robot 202 by activating or energizing a charging circuit of charging circuitry 168. In some implementations, controller 164 may activate or energize the charging circuit based on receiving the instruction from mobile robot 202. Controller 164 may activate or energize the charging circuit by closing or opening a charging relay of charging circuitry 168. The closing or opening of the charging relay may cause the charging circuit to be activate, which may cause electrical charge or electrical current to flow from charging element(s) 126 to the battery of mobile robot 202 through the charging element(s) of mobile robot 202.

Figure 2F:
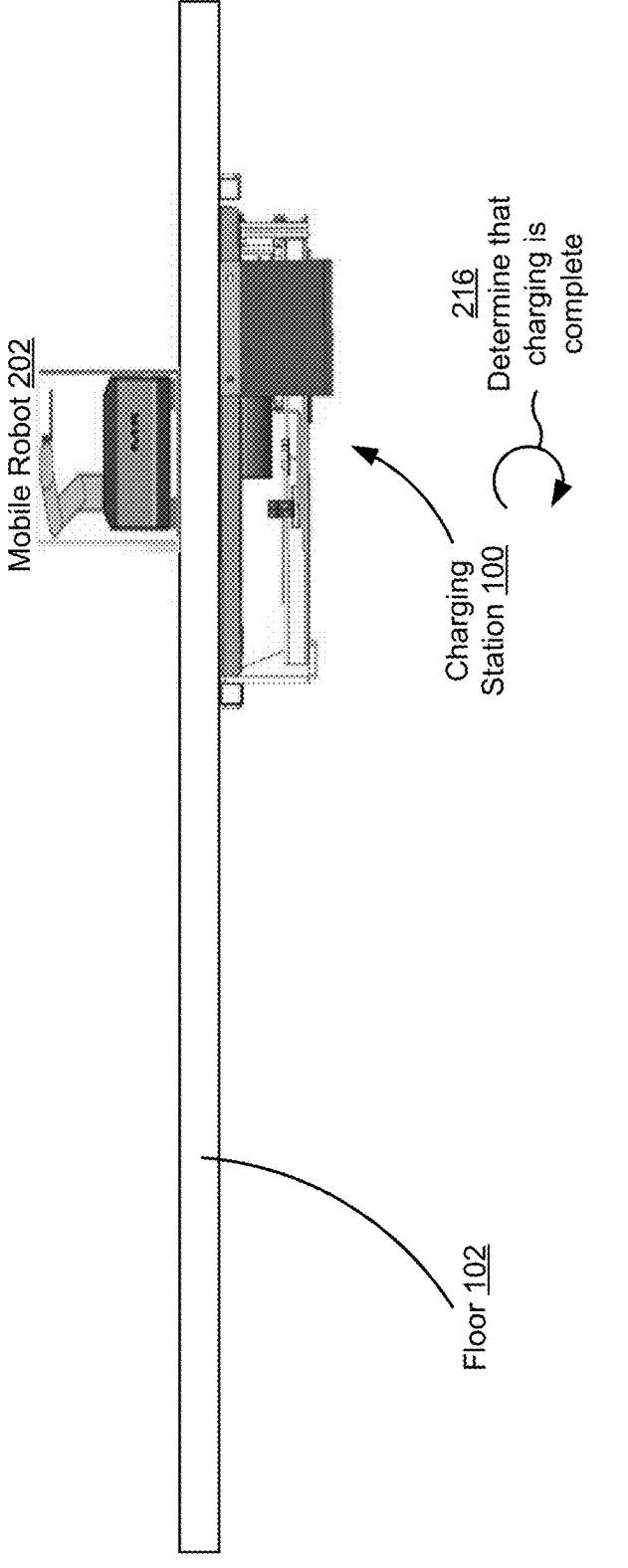

As shown in FIG. 2F, and by reference number 216, charging station 100 may determine that charging of mobile robot 202 is complete. In these cases, charging station 100 may stop charging mobile robot 202 based on determining that charging of mobile robot 202 is complete. Charging station 100 may determine that charging of mobile robot 202 is complete and may cause charging station 100 to stop charging mobile robot 202 using various components, such as controller 164 and/or the like. In some implementations, controller 164 may determine that charging of mobile robot 202 is complete based on expiration of a charging timer, which may expire when or prior to the battery of mobile robot 202 being fully recharged. In some implementations, controller 164 may determine that charging of mobile robot 202 is complete based on receiving an instruction to stop charging, which may be received when or prior to the battery of mobile robot 202 being fully recharged.

In some implementations, controller 164 may communicate with mobile robot 202 to receive information identifying a charge level of the battery of mobile robot 202 and a threshold charge level for the battery. Accordingly, controller 164 may determine that charging of mobile robot 202 is complete when the charge level of the battery satisfies the threshold charge level. The charge level and the threshold charge level may be indicated by respective voltages, respective electrical currents, and/or other indicators. Controller 164 may cause charging station 100 to stop charging mobile robot 202 by deactivating or deenergizing the charging circuit. For example, controller 164 may deactivate or deenergize the charging circuit by opening or closing the charging relay.

Figure 2G:
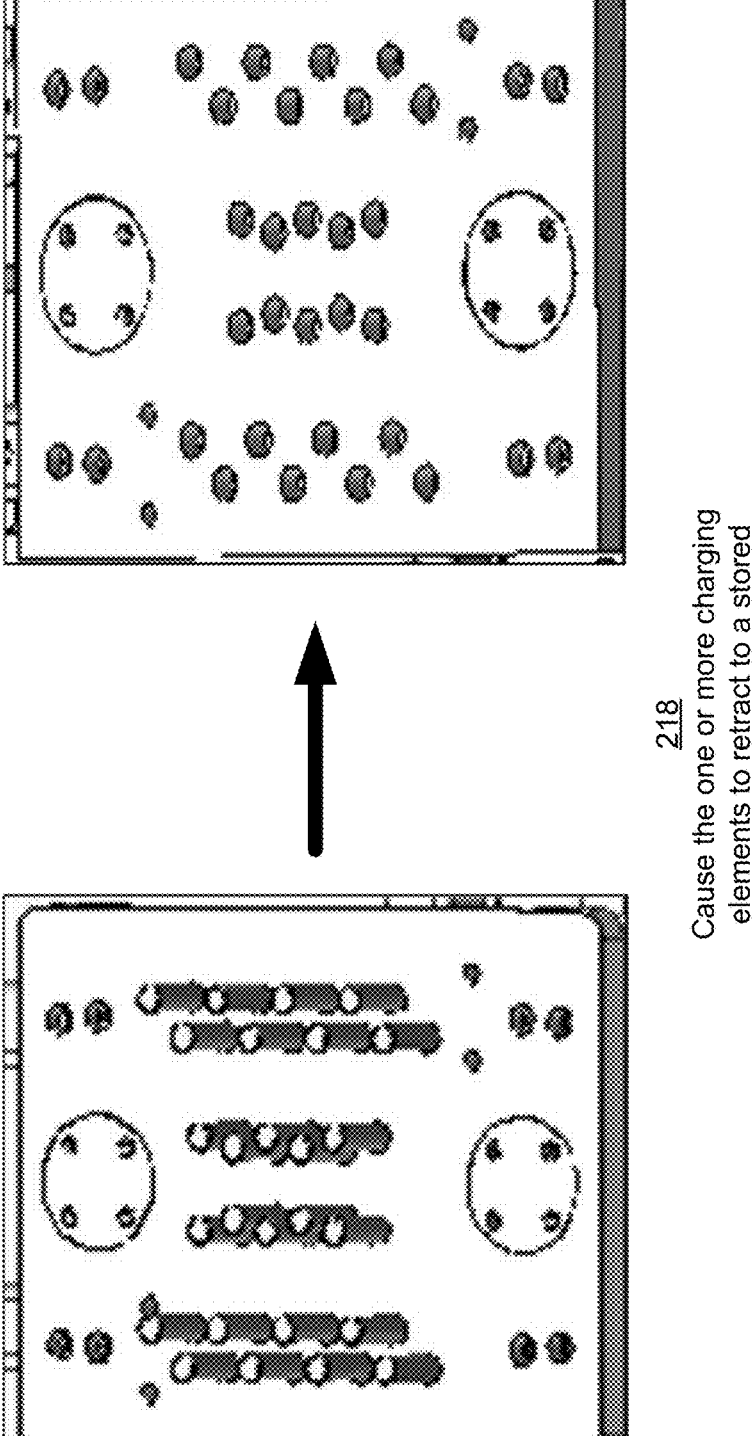

As shown in FIG. 2G, and by reference number 218, charging station 100 may cause charging element(s) 126 to retract to the stored position for storage after charging mobile robot 202. Charging station 100 may cause charging element(s) 126 to retract to the stored position based on determining that charging of mobile robot 202 is complete. Charging station 100 may use various components to cause charging element(s) 126 to retract to the stored position, such as motor 118, sensors 138, turning member 130, controller 164, and/or the like. For example, controller 164 may receive, from sensor 138b, sensor information indicating a position of middle plate 110. The sensor information may indicate that middle plate 110 (and thus, charging element(s) 126) is in the charging position. Accordingly, controller 164 may transmit a signal or instruction to motor 118 to activate motor 118. Motor 118 may cause, though linkage 128, turning member 130 to rotate in a direction that causes the height or vertical position of middle plate to decrease, thereby causing middle plate 110 (and thus, charging element(s) 126) to transition from the charging position to the stored position.

Charging station 100 may determine that middle plate 110 (and thus, charging element(s) 126) are in the stored position. Charging station 100 may use various components to determine that middle plate 110 (and thus, charging element(s) 126) is in the stored position, such as sensors 138, controller 164, and/or the like. Controller 164 may receive, from sensor 138c, sensor information indicating that middle plate 110 (and thus, charging element(s) 126) has reached the stored position. Controller 164 may cause, based on receiving the sensor information indicating that middle plate 110 (and thus, charging element(s) 126) has reached the stored position, motor 118 to deactivate and to cease causing turning member 130 to decrease the height or vertical position of middle plate 110.

As indicated above, FIGS. 2A-2G are provided as one or more examples. Other examples may differ from what is described with regard to FIGS. 2A-2G.

Figure 3:
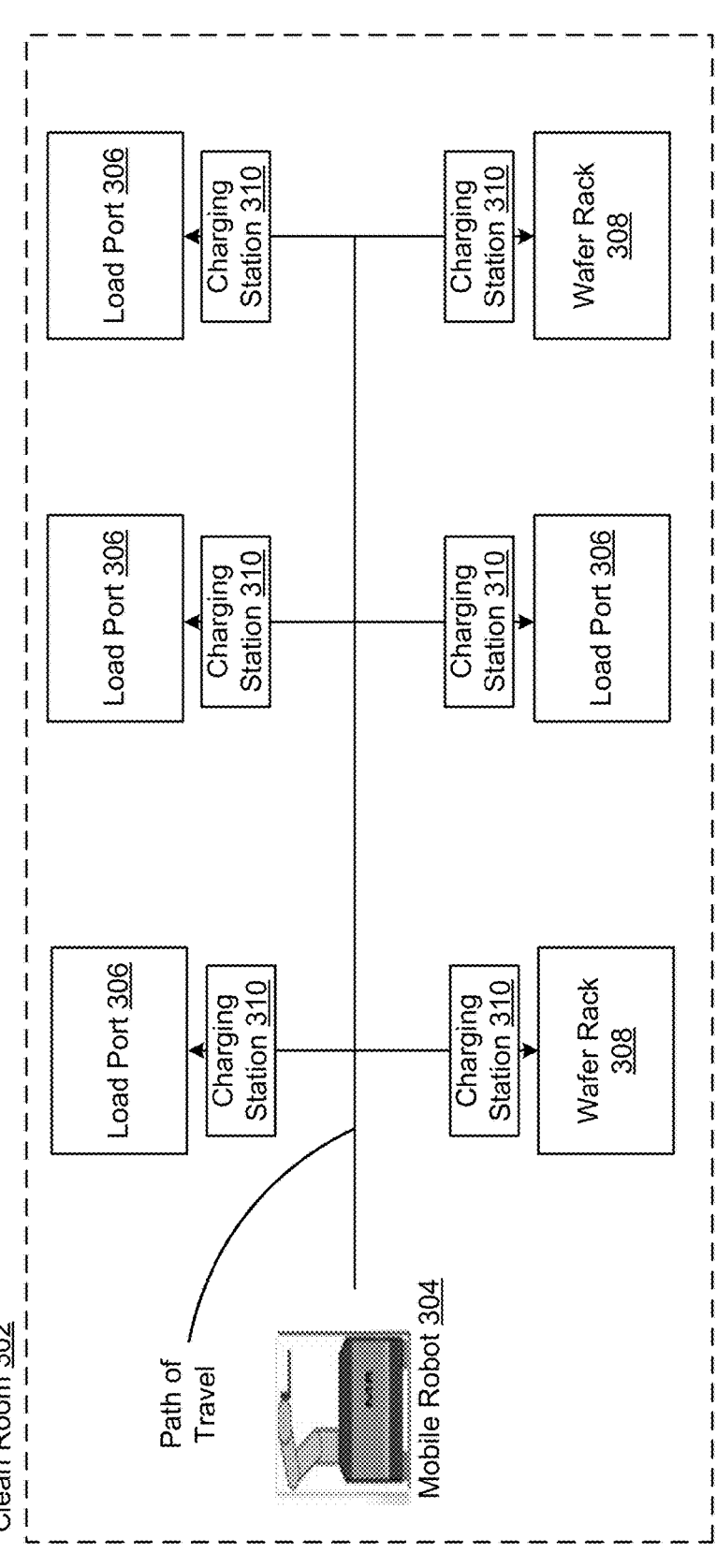
FIG. 3 is a diagram of an example environment in which systems and/or methods described herein may be implemented.

FIG. 3 is a diagram of an example environment 300 in which systems and/or methods described herein may be implemented. As shown in FIG. 3, environment 300 may include a clean room 302 in which a mobile robot 304 travels along a path of travel to transport wafers, dies, and/or other items throughout clean room 302. Mobile robot 304 may transport wafers, dies, and/or other items between one or more loading ports 306, one or more wafer racks 308, and/or one or more other locations in clean room 302. Moreover, mobile robot 304 may be charged by one or more charging stations 310 in clean room 302.

Clean room 302 may be a clean room for manufacturing wafers, various types of semiconductor devices (e.g., transistors, memory devices, processors, analog devices (e.g., sensors, signal processing devices, and/or the like), semiconductor light emitting diodes (LEDs), semiconductor lasers, and/or the like, and/or components thereof.

Mobile robot 304 may be an automated mobile device (e.g., mobile robot 202) that is capable of transporting wafers, dies, and/or other items throughout clean room 302. For example, mobile robot 304 may be a battery-powered robot, a battery-powered motorized cart, a mobile and/or battery-powered tram or trolley, or another type of battery-powered device. In some implementations, mobile robot 304 travels along a path of travel between various locations in clean room 302, which may include stops at locations including loading port(s) 306, wafer rack(s) 308, and/or the like. In some implementations, the path of travel of mobile robot 304 is semi-autonomous or configured to transport wafers, dies, and/or other items as needed or at particular times and in a particular order to support the various semiconductor processes carried out in clean room 302. In some implementations, mobile robot 304 is capable of transporting wafer containers (e.g., containers capable of holding wafer lots), die containers (e.g., containers capable of holding die lots), individual wafers, and/or the like.

Load port 306 includes a container dock, a wafer port, a die port, a staging location, and/or the like associated with a semiconductor processing device or system. For example, load port 306 may be a wafer container dock, of a semiconductor processing device, on which a wafer container is placed such that wafers in the wafer container can be loaded from the wafer container into the semiconductor processing device for processing. The semiconductor processing device or system may be a lithography device (e.g., a spin coating device, an exposure device, a developer device, and/or the like), a deposition device (e.g., a chemical vapor deposition device, a physical vapor deposition device, and/or the like), an etching device, or another type of semiconductor processing device. Wafer rack 308 includes a rack, a shelf, a storage cabinet, or another structure configured to hold wafers, dies, wafer containers, die containers, and/or the like.

Charging station 310 includes a charging station (e.g., charging station 100) capable of being mounted under a floor of clean room 302 and capable of charging mobile robot 304. For example, charging station 310 may detect mobile robot 304 near charging station 310, may determine whether mobile robot 304 is positioned over a charging region of charging station 310, may cause one or more charging elements of charging station 310 to transition to a charging position in which at least a portion of the one or more charging elements extend above the floor of clean room 302, may activate charge circuitry to charge the mobile robot while the one or more charging elements are in the charging position, and/or the like.

The number and arrangement of devices shown in FIG. 3 are provided as one or more examples. In practice, there may be additional devices, fewer devices, different devices, or differently arranged devices than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of environment 300 may perform one or more functions described as being performed by another set of devices of environment 300.

Figure 4:
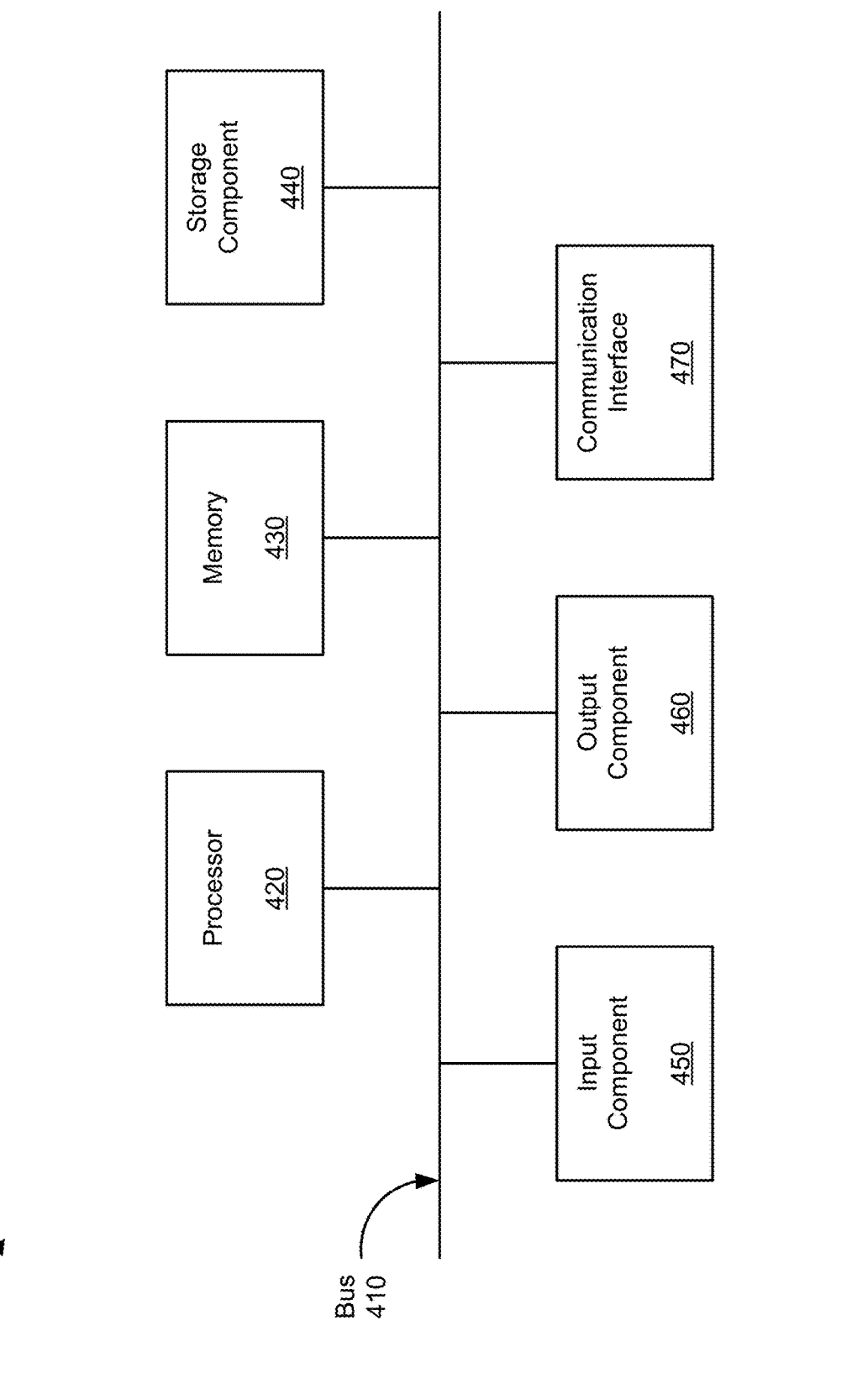
FIG. 4 is a diagram of example components of one or more devices of FIGS. 1A-1G and/or 2A-2G.

FIG. 4 is a diagram of example components of a device 400. Device 400 may correspond to controller 164, mobile robot 202, mobile robot 304, and/or the like. In some implementations, controller 164, mobile robot 202, mobile robot 304, and/or the like may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flow chart of an example process 500 associated with charging a mobile robot. In some implementations, one or more process blocks of FIG. 5 may be performed by a controller of a charging station (e.g., controller 164 of charging station 100, a controller of charging station 310, device 400, and/or the like).

As shown in FIG. 5, process 500 may include receiving, from one or more first sensors, sensor information associated with a position of a mobile robot to be charged by an under-floor charging station associated with the device (block 510). For example, the controller (e.g., using processor 420, memory 430, storage component 440, input component 450, output component 460, communication interface 470, and/or the like) may receive, from one or more first sensors (e.g., one or more sensors 140), sensor information associated with a position of a mobile robot (e.g., mobile robot 202, mobile robot 304, and/or the like) to be charged by an under-floor charging station (e.g., charging station 100, charging station 310, and/or the like) associated with the device, as described above.

As further shown in FIG. 5, process 500 may include determining, based on the sensor information associated with the position of the mobile robot, that the mobile robot is positioned over a charging region of the under-floor charging station (block 520). For example, the controller (e.g., using processor 420, memory 430, storage component 440, input component 450, output component 460, communication interface 470, and/or the like) may determine, based on the sensor information associated with the position of the mobile robot, that the mobile robot is positioned over a charging region (e.g., charging region 160) of the under-floor charging station, as described above.

As further shown in FIG. 5, process 500 may include causing, based on determining that the mobile robot is positioned over the charging region, one or more charging elements to extend at least partially through a top plate of the under-floor charging station to a charging position (block 530). For example, the controller (e.g., using processor 420, memory 430, storage component 440, input component 450, output component 460, communication interface 470, and/or the like) may cause, based on determining that the mobile robot is positioned over the charging region, one or more charging elements (e.g., one or more charging elements 126) to extend at least partially through a top plate (e.g., top plate 112) of the under-floor charging station to a charging position, as described above.

As further shown in FIG. 5, process 500 may include causing the under-floor charging station to charge the mobile robot while the one or more or more charging elements are in the charging position (block 540). For example, the controller (e.g., using processor 420, memory 430, storage component 440, input component 450, output component 460, communication interface 470, and/or the like) may cause the under-floor charging station to charge the mobile robot while the one or more or more charging elements are in the charging position, as described above.

Process 500 may include additional implementations, such as any single implementation or any combination of implementations described below and/or in connection with one or more other processes described elsewhere herein.

In a first implementation, process 500 includes causing the one or more charging elements to move from a stored position toward the charging position, determining, based on sensor information received from one or more second sensors (e.g. one or more sensors 138), that the one or more charging elements are in the charging position, and causing the one or more charging elements to stop moving based on determining that the one or more charging elements are in the charging position. In a second implementation, alone or in combination with the first implementation, process 500 includes determining that charging of the mobile robot is complete, and causing, based on determining that charging of the mobile robot is complete, the one or more charging elements to retract through the top plate to a stored position in which the one or more is charging elements are positioned below a top surface (e.g., top surface 116) of the top plate.

In a third implementation, alone or in combination with one or more of the first and second implementations, process 500 includes causing the one or more charging elements to move from the charging position toward the stored position, determining, based on sensor information received from one or more second sensors (e.g., one or more sensors 138), that the one or more charging elements are in the stored position, and causing the one or more charging elements to stop moving based on determining that the one or more charging elements are in the stored position.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flow chart of an example process 600 associated with charging a mobile robot. In some implementations, one or more process blocks of FIG. 6 may be performed by a controller of a charging station (e.g., controller 164 of charging station 100, a controller of charging station 310, device 400, and/or the like).

As shown in FIG. 6, process 600 may include detecting, based on motion detection circuitry, a mobile robot near an under-floor charging station (block 610). For example, the controller (e.g., using processor 420, memory 430, storage component 440, input component 450, output component 460, communication interface 470, and/or the like) may detect, based on motion detection circuitry (e.g., motion detection circuitry 166), a mobile robot (e.g., mobile robot 202, mobile robot 304, and/or the like) near an under-floor charging station (e.g., charging station 100, charging station 310, and/or the like), as described above.

As further shown in FIG. 6, process 600 may include determining, based on detecting the mobile robot, whether the mobile robot is positioned over a charging region of the under-floor charging station (block 620). For example, the controller (e.g., using processor 420, memory 430, storage component 440, input component 450, output component 460, communication interface 470, and/or the like) may determine, based on detecting the mobile robot, whether the mobile robot is positioned over a charging region (e.g., charging region 160) of the under-floor charging station, as described above.

As further shown in FIG. 6, process 600 may include causing, based on determining that the mobile robot is positioned over the charging region, one or more charging elements of the under-floor charging station to transition to a charging position in which at least a portion of the one or more charging elements extend above a floor on which the mobile robot travels (block 630). For example, the controller (e.g., using processor 420, memory 430, storage component 440, input component 450, output component 460, communication interface 470, and/or the like) may cause, based on determining that the mobile robot is positioned over the charging region, one or more charging elements (e.g., charging elements 126) of the under-floor charging station to transition to a charging position in which at least a portion of the one or more charging elements extend above a floor (e.g., floor 102) on which the mobile robot travels, as described above.

As further shown in FIG. 6, process 600 may include determining whether the one or more charging elements are in the charging position (block 640). For example, the controller (e.g., using processor 420, memory 430, storage component 440, input component 450, output component 460, communication interface 470, and/or the like) may determine whether the one or more charging elements are in the charging position, as described above.

As further shown in FIG. 6, process 600 may include causing, based on determining that the one or more charging elements are in the charging position, charging circuitry to activate to charge the mobile robot (block 650). For example, the controller (e.g., using processor 420, memory 430, storage component 440, input component 450, output component 460, communication interface 470, and/or the like) may cause, based on determining that the one or more charging elements are in the charging position, charging circuitry (e.g., charging circuitry 168) to activate to charge the mobile robot, as described above.

Process 600 may include additional implementations, such as any single implementation or any combination of implementations described below and/or in connection with one or more other processes described elsewhere herein.

In a first implementation, determining whether the mobile robot is positioned over the charging region includes receiving, from one or more sensors (e.g., one or more sensors 140), sensor information associated with a position of the mobile robot, and determining whether the mobile robot is positioned over the charging region based on the sensor information associated with the position of the mobile robot. In a second implementation, alone or in combination with the first implementation, the one or more sensors are one or more reflective fiber sensors, and the sensor information associated with the position of the mobile robot indicates whether a reflection from one or more reflectors (e.g., one or more reflectors 206) associated with the mobile robot is received by the one or more reflective fiber sensors.

In a third implementation, alone or in combination with one or more of the first and second implementations, process 600 includes determining, after a threshold time period from detecting the mobile robot, that the mobile robot is not positioned over the charging region, and triggering an alarm based on determining that the mobile robot is not positioned over the charging region. In a fourth implementation, alone or in combination with one or more of the first through third implementations, the one or more sensors are one or more reflective fiber sensors, and determining that the mobile robot is not positioned over the charging region includes determining that the mobile robot is not positioned over the charging region based on the sensor information associated with the position of the mobile robot indicating that a reflection from at least one reflector associated with the mobile robot is not received by at least one of the one or more reflective fiber sensors.

In a fifth implementation, alone or in combination with one or more of the first through fourth implementations, causing the charging circuitry to activate includes causing, based on receiving the instruction, a charging relay to activate a charging circuit to charge the mobile robot. In a sixth implementation, alone or in combination with one or more of the first through fifth implementations, determining whether the one or more charging elements are in the charging position includes receiving, from a sensor associated with the charging position (e.g., sensor 138*b*), sensor information associated with a position of a plate on which the one or more charging elements are supported, and determining whether the one or more charging elements are in the charging position based on the sensor information associated with the position of the plate.

In a seventh implementation, alone or in combination with one or more of the first through sixth implementations, process 600 includes causing the one or more charging elements to transition from the charging position to a stored position; receiving, from a sensor associated with the stored position (e.g., sensor 138*c*), other sensor information associated with the position of the plate; and determining whether the one or more charging elements are in the stored position based on the other sensor information associated with the position of the plate.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
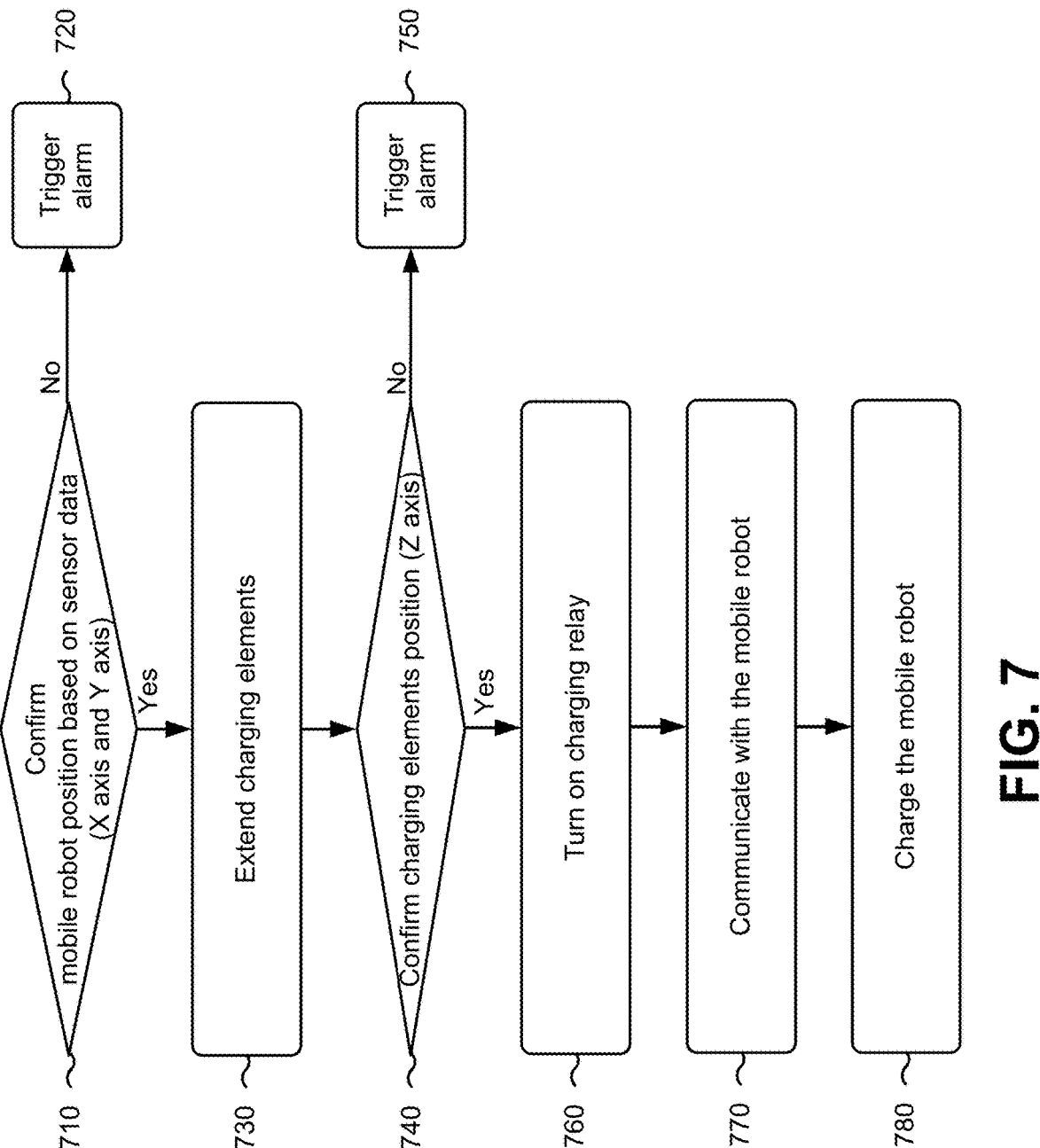

FIG. 7 is a flowchart of an example process 700 for charging a mobile robot. In some implementations, one or more process blocks of FIG. 7 may be performed by a controller of a charging station (e.g., controller 164 of charging station 100, a controller of charging station 310, device 400, and/or the like).

As shown in FIG. 7, process 700 may include confirming a mobile robot position based on sensor data (block 710). For example, the controller (e.g., using processor 420, memory 430, storage component 440, input component 450, output component 460, communication interface 470, and/or the like) may confirm a mobile robot position based on sensor data, as described above. In some implementations, the sensor data may indicate an X axis position of a mobile robot (e.g., mobile robot 202, mobile robot 304, and/or the like), a Y axis position of the mobile robot, and/or the like.

In some implementations, the sensor data may be generated by one or more X axis and Y axis sensors (e.g., sensor(s) 140).

As further shown in FIG. 7, if the mobile robot position cannot be confirmed (block 710-No), process 700 may include triggering an alarm (block 720). For example, the controller (e.g., using processor 420, memory 430, storage component 440, input component 450, output component 460, communication interface 470, and/or the like) may trigger an alarm, as described above. In some implementations, the alarm may be an audible alarm (e.g., a siren, a buzzer, a voice alarm, and/or the like), a visual alarm (e.g., a light indicator, an indicator on an electronic display, and/or the like), or another type of alarm to indicate that the mobile robot position cannot be confirmed. In some implementations, the alarm may be triggered if the mobile robot position cannot be confirmed after a particular amount of time from the mobile robot being detected near the charging station.

As further shown in FIG. 7, if the mobile robot position is confirmed (block 710-Yes), process 700 may include extending charging elements of the charging station (block 730). For example, the controller (e.g., using processor 420, memory 430, storage component 440, input component 450, output component 460, communication interface 470, and/or the like) may extend charging elements of the charging station, as described above. In some implementations, the charging elements (e.g., charging elements 126) may be in a stored position, and may extend from the stored position to a charging position. In the charging position, at least a portion of the charging elements may extend above a top surface (e.g., top surface 114) of a floor (e.g., floor 102).

As further shown in FIG. 7, process 700 may include confirming a position of the charging elements (block 740). For example, the controller (e.g., using processor 420, memory 430, storage component 440, input component 450, output component 460, communication interface 470, and/or the like) may confirm a position of the charging elements, as described above. In some implementations, the controller may confirm the position of the charging elements based on Z axis sensor data. The Z axis sensor data my indicate a Z axis position of the charging elements or a plate (e.g., middle plate 110) on which the charging elements are positioned. In some implementations, the sensor data may be generated by one or more Z axis sensors (e.g., sensors 138).

As further shown in FIG. 7, if the position of the charging elements cannot be confirmed (block 740-No), process 700 may include triggering an alarm (block 750). For example, the controller (e.g., using processor 420, memory 430, storage component 440, input component 450, output component 460, communication interface 470, and/or the like) may trigger an alarm, as described above. In some implementations, the alarm may be an audible alarm (e.g., a siren, a buzzer, a voice alarm, and/or the like), a visual alarm (e.g., a light indicator, an indicator on an electronic display, and/or the like), or another type of alarm to indicate that the charging elements cannot be confirmed. In some implementations, the alarm may be triggered if the position of the charging elements is incorrect or cannot be confirmed after initial movement of the charging elements from the storage position.

As further shown in FIG. 7, if the position of the charging elements is confirmed (block 740-Yes), process 700 may include turning on a charging relay (block 760). For example, the controller (e.g., using processor 420, memory 430, storage component 440, input component 450, output component 460, communication interface 470, and/or the like) may turn on a charging relay, as described above. In some implementations, the charging relay maybe included as part of charging circuitry (e.g., charging circuitry 168) of the charging station. Turning on the charging relay may activate a charge circuit included in the charging circuitry.

As further shown in FIG. 7, process 700 may include communicating with the mobile robot (block 770). For example, the controller (e.g., using processor 420, memory 430, storage component 440, input component 450, output component 460, communication interface 470, and/or the like) may communicate with the mobile robot, as described above. In some implementations, the mobile robot may initiate communication with the charging station to initiate charging of the mobile robot.

As further shown in FIG. 7, process 700 may include charging the mobile robot (block 780). For example, the controller (e.g., using processor 420, memory 430, storage component 440, input component 450, output component 460, communication interface 470, and/or the like) may charge the mobile robot, as described above. In some implementations, the controller may cause the charging circuit to charge the mobile robot based on the mobile robot initiating communication with the charging station. In some implementations, the controller may cause the charging circuit to cause current to flow through the charging elements and to charging elements of the mobile robot to charge the mobile robot.

Process 700 may include additional implementations, such as any single implementation or any combination of implementations described in connection with one or more other processes described elsewhere herein. Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, under-floor charging station (e.g., under-floor charging station 100, under-floor charging station 310, and/or the like) can be mounted beneath a floor (e.g., floor 102) such as a raised clean room floor or another type of floor in which a top plate (e.g., top plate 112) of the under-floor charging station is substantially flush with a top surface (e.g., top surface 114) of the floor without touching the ground. Openings (e.g., openings 158) in the top plate allow charging elements (e.g., charging elements 126) to extend when in use to charge a mobile robot (e.g., mobile robot 202, mobile robot 304, and/or the like), and to retract under the floor when not in use. The retractable charging elements of the under-floor charging station prevent tripping hazards and allow the mobile robot to move freely throughout a clean room. In particular, the mobile robot can travel over the under-floor charging station without the under-floor charging station interfering with the mobile robot's path of travel. This allows the mobile robot to travel in a more direct path, which reduces the complexity in programming the path of travel of the mobile robot and allows the path of travel of the mobile robot to be more optimized. Moreover, because the charging elements can be retracted in an unobtrusive position when the under-floor charging station is not in use, the under-floor charging station is permitted to be positioned in locations in the clean room that allow the mobile robot to continue working while charging and/or allow non-stop running of the mobile robot. For example, the under-floor charging station may be positioned near wafer racks, loading ports of semiconductor processing equipment, and/or the like such that the mobile robot can charge while loading and unloading wafer/die containers.

As described in greater detail above, some implementations described herein provide a charging station for charging a mobile robot. The charging station includes a first plate having one or more openings through the first plate. The charging station includes a second plate positioned below the first plate. The charging station includes one or more charging elements on the second plate. The charging station includes a motor to cause the second plate to move between a first position and a second position. In the first position, the one or more charging elements are at least partially extended through the one or more openings to charge the mobile robot. In the second position, the one or more charging elements are substantially even with or below a top surface of the first plate.

As described in greater detail above, some implementations described herein provide a device. The device includes one or more memories and one or more processors communicatively coupled to the one or more memories. The one or more memories and one or more processors may be configured to receive, from one or more first sensors, sensor information associated with a position of a mobile robot to be charged by an under-floor charging station associated with the device. The one or more memories and one or more processors may be configured to determine, based on the sensor information associated with the position of the mobile robot, that the mobile robot is positioned over a charging region of the under-floor charging station. The one or more memories and one or more processors may be configured to cause, based on determining that the mobile robot is positioned over the charging region, one or more charging elements to extend at least partially through a top plate of the under-floor charging station to a charging position. The one or more memories and one or more processors may be configured to cause the under-floor charging station to charge the mobile robot while the one or more or more charging elements are in the charging position.

As described in greater detail above, some implementations described herein provide a method. The method includes detecting, by a controller and based on motion detection circuitry, a mobile robot near an under-floor charging station. The method includes determining, by the controller and based on detecting the mobile robot, whether the mobile robot is positioned over a charging region of the under-floor charging station. The method includes causing, by the controller and based on determining that the mobile robot is positioned over the charging region, one or more charging elements of the under-floor charging station to transition to a charging position in which at least a portion of the one or more charging elements extend above a floor on which the mobile robot travels. The method includes determining, by the controller, whether the one or more charging elements are in the charging position. The method includes causing, by the controller and based on determining that the one or more charging elements are in the charging position, charging circuitry to activate to charge the mobile robot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A charging station, comprising:
a first plate having one or more openings;
a second plate, below the first plate, comprising one or more charging elements; and
one or more sensors that detects a position of the second plate,
    wherein the charging station is configured to cause the one or more charging elements to transition to a charging position in which at least a portion of the one or more charging elements at least partially extend through the one or more openings of the first plate.

2. The charging station of claim 1,
wherein a top surface of the first plate and a top surface of a floor are substantially even, and
    wherein the charging station is further configured to cause the one or more charging elements to transition from an initial position in which the one or more charging elements are below the top surface of the floor.

3. The charging station of claim 1,
wherein a top surface of the first plate and a top surface of a floor are substantially even, and
wherein the charging elements at least partially extend above the top surface of the floor when the charging elements are in the charging position.

4. The charging station of claim 1, further comprising:
a third plate positioned below the second plate,
    wherein the second plate is connected to the third plate in a manner that permits a height of the second plate to be adjusted relative to the first plate and the third plate.

5. The charging station of claim 1, further comprising:
a third plate positioned below the second plate; and
one or more support members connected to the third plate,
    wherein the charging station is further configured to horizontally translate the first plate, the second plate, and the third plate via the one or more support members.

6. The charging station of claim 1, further comprising:
a motor configured to adjust a height of the second plate relative to the first plate.

7. The charging station of claim 1, wherein the one or more sensors comprise position sensors configured to detect that the one or more charging elements have reached the charging position in which at least a portion of the one or more charging elements extend above a top surface of the first plate.

8. A device, comprising:
one or more memories; and
one or more processors, coupled to the one or more memories, configured to:
    determine whether a mobile robot is positioned over a charging region of a charging station;
    receive, from a sensor of the charging station, sensor information associated with a position of a middle plate supporting one or more charging elements;
    cause, based on determining whether the mobile robot is positioned over the charging region, the one or more charging elements, associated with the middle plate, to transition to a charging position in which at least a portion of the one or more charging elements at least partially extend through one or more openings of a top plate based on the sensor information; and
    cause the charging station to charge the mobile robot while the one or more charging elements are in the charging position.

9. The device of claim 8,
wherein to determine whether the mobile robot is positioned over the charging region of the charging station, the one or more processors are configured to:
    determine, based on the sensor information, that the mobile robot is positioned over the charging region of the charging station.

10. The device of claim 9, wherein the sensor information indicates that the position of the middle plate is in a non-charging position associated with the one or more charging elements being positioned even with or below a top surface of the top plate.

11. The device of claim 8,
wherein to determine whether the mobile robot is positioned over the charging region of the charging station, the one or more processors are configured to:
    determine that the mobile robot is not positioned over the charging region of the charging station; and
    send instructions to the mobile robot to move to a charging location associated with the charging region.

12. The device of claim 8,
wherein the middle plate is below the top plate in the charging position.

13. The device of claim 8,
wherein the device is the mobile robot.

14. The device of claim 8,
wherein the device is the charging station.

15. A method, comprising:
determining that a mobile robot is positioned over a charging region of a charging station;
receiving, from a first sensor of the charging station, sensor information associated with a position of a first plate supporting one or more charging elements;
determining, based on determining that the mobile robot is positioned over the charging station, whether the one or more charging elements of the charging station are in a non-charging position in which the one or more charging elements do not extend through one or more openings of a second plate, above the first plate, based on the sensor information; and
causing, based on determining that the one or more charging elements of the charging station are in the non-charging position, the one or more charging elements of the charging station to transition to a charging position.

16. The method of claim 15, further comprising:
causing, based on determining that the one or more charging elements are in the charging position, charging circuitry of the charging station to charge the mobile robot via the one or more charging elements.

17. The method of claim 15, further comprising:
wherein determining that the mobile robot is positioned over the charging region is based on the sensor information.

18. The method of claim 15, further comprising:
determining, after a threshold time period from detecting the mobile robot, that the mobile robot is not positioned over the charging region; and
triggering an alarm based on determining that the mobile robot is not positioned over the charging region.

19. The method of claim 15, wherein causing the one or more charging elements of the charging station to transition to the charging position comprises:

changing a height of the second plate.

20. The method of claim 15, further comprising:

initiating, based on causing the one or more charging elements of the charging station to transition to the charging position, charging of the mobile robot.

\* \* \* \* \*